United States Patent
Nishimura et al.

(10) Patent No.: US 9,647,226 B2
(45) Date of Patent: May 9, 2017

(54) ORGANIC ELECTROLUMINESCENT ELEMENT

(71) Applicant: Idemitsu Kosan Co., Ltd., Tokyo (JP)

(72) Inventors: Kazuki Nishimura, Sodegaura (JP); Hiroyuki Saito, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 0 days.

(21) Appl. No.: 14/648,790

(22) PCT Filed: Nov. 28, 2013

(86) PCT No.: PCT/JP2013/082030
§ 371 (c)(1),
(2) Date: Jun. 1, 2015

(87) PCT Pub. No.: WO2014/087913
PCT Pub. Date: Jun. 12, 2014

(65) Prior Publication Data
US 2015/0303391 A1  Oct. 22, 2015

(30) Foreign Application Priority Data
Dec. 3, 2012 (JP) ................. 2012-264652

(51) Int. Cl.
*H01L 51/00* (2006.01)
*H01L 51/50* (2006.01)

(52) U.S. Cl.
CPC ........ *H01L 51/504* (2013.01); *H01L 51/0067* (2013.01); *H01L 51/0072* (2013.01); *H01L 51/5016* (2013.01); *H01L 51/5036* (2013.01); *H01L 51/0052* (2013.01); *H01L 51/0061* (2013.01); *H01L 51/0068* (2013.01); *H01L 51/0085* (2013.01); *H01L 2251/308* (2013.01); *H01L 2251/5384* (2013.01)

(58) Field of Classification Search
CPC .................... H01L 51/504; H01L 51/5036
USPC ........................................... 257/40
See application file for complete search history.

(56) References Cited

U.S. PATENT DOCUMENTS

| | | |
|---|---|---|
| 2005/0158582 A1 | 7/2005 | Ise et al. |
| 2006/0105201 A1 | 5/2006 | Lee et al. |
| 2006/0257684 A1 | 11/2006 | Arakane et al. |
| 2007/0099026 A1 | 5/2007 | Lee et al. |

(Continued)

FOREIGN PATENT DOCUMENTS

| | | |
|---|---|---|
| JP | 2005-228737 A | 8/2005 |
| JP | 2007-027092 A | 2/2007 |

(Continued)

OTHER PUBLICATIONS

International Search Report issued in International Patent Application No. PCT/JP2013/082030 mailed Feb. 25, 2014.

*Primary Examiner* — Tuan Nguyen
(74) *Attorney, Agent, or Firm* — Foley & Lardner LLP

(57) ABSTRACT

An organic electroluminescence device according of the invention includes an anode, a cathode, and at least a first emitting layer and a second emitting layer interposed between the anode and the cathode. The first emitting layer includes a first host material and a first dopant material. The second emitting layer includes a second host material, a third host material and a second dopant material.

11 Claims, 4 Drawing Sheets

(56) References Cited

U.S. PATENT DOCUMENTS

| | | | |
|---|---|---|---|
| 2010/0044689 A1* | 2/2010 | Nishimura | C09K 11/06 257/40 |
| 2010/0295027 A1* | 11/2010 | Kawamura | C09K 11/06 257/40 |
| 2012/0119197 A1 | 5/2012 | Nishimura et al. | |
| 2013/0126849 A1 | 5/2013 | Arakane et al. | |

FOREIGN PATENT DOCUMENTS

| | | |
|---|---|---|
| JP | 2010-161410 A | 7/2010 |
| JP | 2011-160003 A | 8/2011 |
| WO | WO-2009/011327 A1 | 1/2009 |
| WO | WO-2009/069717 A1 | 6/2009 |
| WO | WO-2010/064655 A1 | 6/2010 |
| WO | WO-2010/134350 A1 | 11/2010 |
| WO | WO-2010/134352 A1 | 11/2010 |
| WO | WO-2011/148909 A1 | 12/2011 |

* cited by examiner

ORGANIC ELECTROLUMINESCENT ELEMENT

TECHNICAL FIELD

The present invention relates to an organic electroluminescence device.

BACKGROUND ART

An organic electroluminescence device (hereinafter, occasionally abbreviated as organic EL device) using an organic substance is highly expected to be used as an inexpensive solid-emitting full-color display device having a large area and has been variously developed. A typical organic EL device includes an emitting layer and a pair of opposing electrodes between which the emitting layer is interposed. When an electric field is applied on both electrodes, electrons are injected from the cathode while holes are injected from the anode. Further, the electrons are recombined with the holes in the emitting layer to generate an excited state. When the excited state is returned to a ground state, energy is emitted as light.

A typical organic EL device exhibits a higher drive voltage and lower luminance intensity and lower luminous efficiency than those of an inorganic light-emitting diode. In addition, a considerable deterioration of the properties is found in the typical organic EL device. Although the organic EL device has been gradually improved in recent years, further reduction of voltage, higher luminous efficiency, longer lifetime, improvement in color reproduction and the like have been demanded.

An organic EL device disclosed in Patent Literature 1 includes a first emitting layer and a second emitting layer, in which a first host material contained in the first emitting layer is an amine derivative and a second host material contained in the second emitting layer is one of a monoazine derivative, diazine derivative and triazine derivative. In the organic EL device disclosed in Patent Literature 1, two emitting layers emit lights in good balance, so that the organic EL device is driven at a low voltage and exhibits a favorable luminous efficiency.

CITATION LIST

Patent Literature(S)

Patent Literature 1: International Publication No. WO2011/148909

SUMMARY OF THE INVENTION

Problems to be Solved by the Invention

However, Patent Literature 1 only discloses that the two emitting layers of the organic EL device emit lights in good balance, but fails to disclose that the entire emission color is adjusted to a desired chromaticity by relatively adjusting luminous intensities of the two emitting layers. As a method of changing the chromaticity, it is conceivable to change a film thickness of each of the emitting layers and/or to change a dopant concentration of each of the emitting layers. However, for instance, when the film thickness of each of the emitting layers is decreased, a lifetime of the organic EL device is shortened. On the other hand, when the film thickness of each of the emitting layers is increased, a drive voltage of the organic EL device is increased. Moreover, for instance, when the dopant concentration is increased, concentration quenching may occur to reduce the luminous efficiency.

An object of the invention is to provide an organic electroluminescence device easily adjustable in chromaticity of light when the organic electroluminescence device emits.

Means for Solving the Problems

An organic electroluminescence device according to an aspect of the invention includes: an anode; a cathode; and at least a first emitting layer and a second emitting layer interposed between the anode and the cathode, in which the first emitting layer includes a first host material and a first dopant material and the second emitting layer includes a second host material, a third host material and a second dopant material.

According to the above aspect of the invention, an organic electroluminescence device easily adjustable in chromaticity of light when the organic electroluminescence device emits can be provided.

DESCRIPTION OF EMBODIMENT(S)

Arrangement(s) of Organic EL Device

Figure 1:
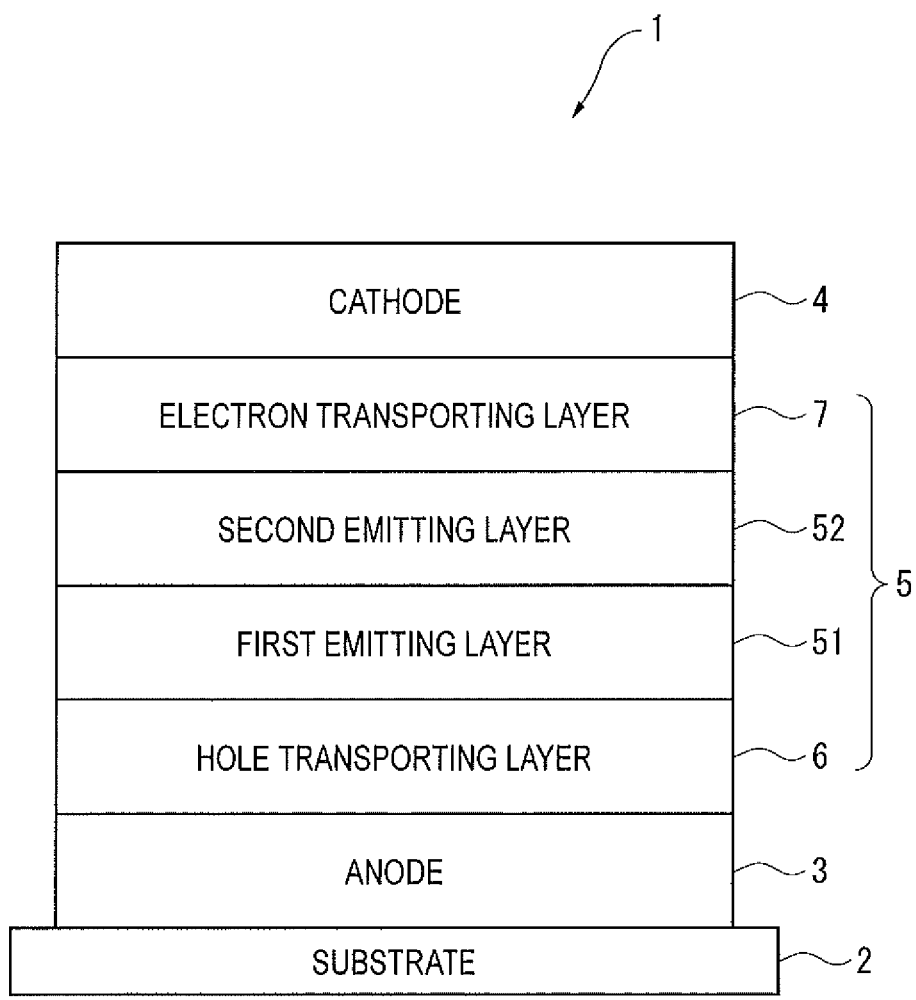
FIG. 1 schematically shows an exemplary arrangement of an organic EL device according to a first exemplary embodiment of the invention.

Arrangements) of an organic EL device according to an exemplary embodiment will be described below.

The organic EL device according to the exemplary embodiment includes a cathode, an anode, and an organic compound layer interposed between the cathode and the anode. The organic compound layer includes a plurality of layers formed of an organic compound. The organic compound layer may include an inorganic compound.

The organic compound layer includes a plurality of emitting layers at least including a first emitting layer and a second emitting layer. The organic compound layer may include a third emitting layer adjacent to the second emitting layer.

In addition, the organic compound layer may include layers applied in a known organic EL device such as a hole injecting layer, a hole transporting layer, an electron injecting layer, an electron transporting layer, a hole blocking layer, an electron blocking layer and a space layer.

Examples of arrangements of the organic EL device of the exemplary embodiment of the invention include:

(a) anode/first emitting layer/second emitting layer/cathode;
(b) anode/hole injecting•transporting layer/first emitting layer/second emitting layer/cathode;
(c) anode/first emitting layer/second emitting layer/electron injecting•transporting layer/cathode;

(d) anode/hole injecting•transporting layer/first emitting layer/second emitting layer/electron injecting•transporting layer/cathode;
(e) anode/hole injecting•transporting layer/first emitting layer/blocking layer/second emitting layer/electron injecting•transporting layer/cathode;
(f) anode/first emitting layer/second emitting layer/third emitting layer/cathode;
(g) anode/hole injecting•transporting layer/first emitting layer/second emitting layer/third emitting layer/cathode;
(h) anode/third emitting layer/first emitting layer/second emitting layer/electron injecting•transporting layer/cathode;
(i) anode/hole injecting•transporting layer/first emitting layer/second emitting layer/third emitting layer/electron injecting•transporting layer/cathode;
(j) anode/hole injecting•transporting layer/first emitting layer/second emitting layer/blocking layer/electron injecting•transporting layer/cathode; and
(k) anode/hole injecting•transporting layer/first emitting layer/second emitting layer/blocking layer/third emitting layer/electron injecting•transporting layer/cathode.

Although the arrangements (d), (e), (i) and (k) are favorably used among the above arrangements, the arrangement of the invention is not limited to the above arrangements.

It should be noted that the aforementioned "emitting layer" is an organic layer generally employing a doping system and including a host material and a dopant material. In general, the host material promotes recombination of electrons and holes and transmits exciton energy generated by recombination to the dopant material. The dopant material is preferably a compound having a high quantum yield. The dopant material exhibits a high luminescent performance after receiving exciton energy from the host material.

The "hole injecting•transporting layer" means "at least one of a hole injecting layer and a hole transporting layer" while the "electron injecting•transporting layer" means "at least one of an electron injecting layer and an electron transporting layer." Herein, when the hole injecting layer and the hole transporting layer are provided, the hole injecting layer is preferably adjacent to the anode. When the electron injecting layer and the electron transporting layer are provided, the electron injecting layer is preferably adjacent to the cathode.

In the invention, the electron transporting layer means an organic layer having the highest electron mobility among the electron injecting•transporting layers existing between the emitting layer and the cathode. When the electron injecting•transporting layer is provided by a single layer, the single layer is the electron transporting layer. Moreover, in the phosphorescent device, a blocking layer having an electron mobility that is not always high may be provided as shown in the arrangement (i) between the emitting layer and the electron transporting layer in order to prevent diffusion of exciton energy generated in the emitting layer. Thus, the organic layer adjacent to the emitting layer does not always correspond to the electron transporting layer.

First Exemplary Embodiment

FIG. 1 schematically shows an exemplary arrangement of an organic EL device according to a first exemplary embodiment of the invention.

An organic EL device 1 includes a transparent substrate 2, an anode 3, a cathode 4 and an emitting unit 5 interposed between the anode 3 and the cathode 4. The emitting unit 5 includes a hole transporting layer 6, a first emitting layer 51, a second emitting layer 52 and an electron transporting layer 7 sequentially from the anode 3.

Emitting Layer

In the organic EL device 1 in the first exemplary embodiment, the first emitting layer 51 contains a first host material and a first dopant material. The second emitting layer 52 contains a second host material, a third host material and a second dopant material.

First Emitting Layer

First Host Material

The first host material is preferably selected from an amine derivative such as a monoamine compound, a diamine compound, a triamine compound, a tetramine compound and an amine compound substituted by a carbazole group, and a compound having a fused aromatic ring. As the above, the amine compound substituted by a carbazole group and the compound having a fused aromatic ring are preferable.

The amine derivative is preferably compounds represented by formulae (1) to (7) below.

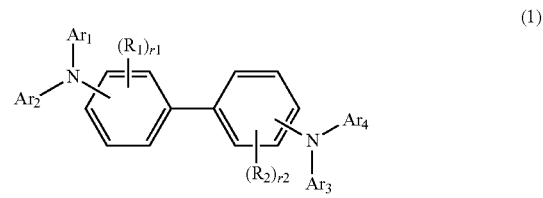

(1)

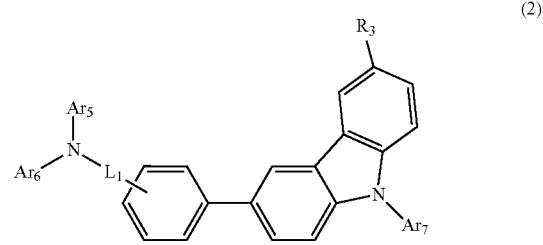

(2)

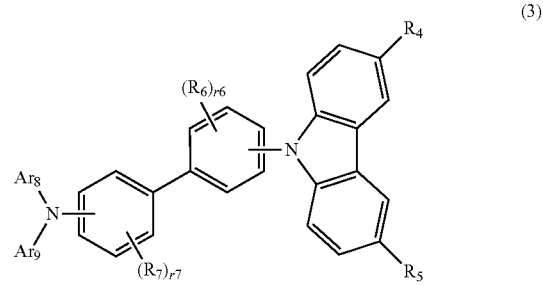

(3)

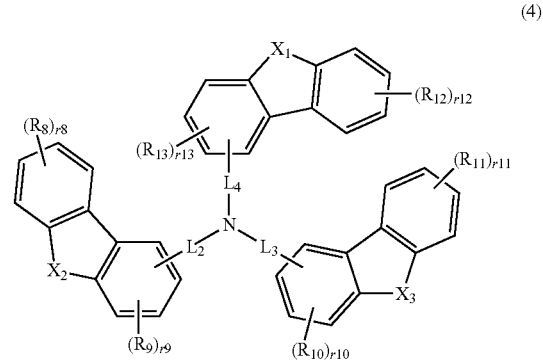

(4)

-continued

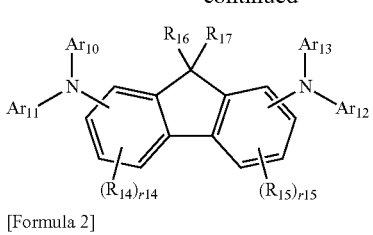
(5)

[Formula 2]

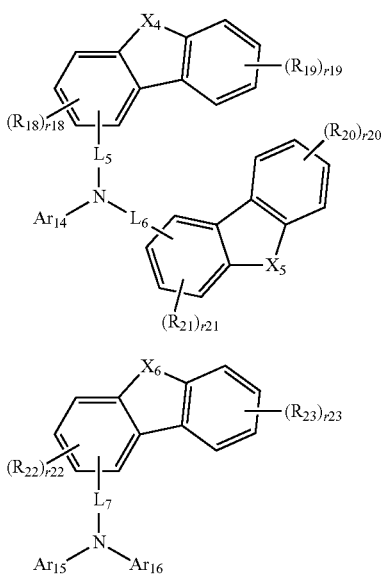
(6)

(7)

In the formula (1), $Ar_1$ to $Ar_4$ are a substituted or unsubstituted aromatic hydrocarbon group having 6 to 40 ring carbon atoms or a substituted or unsubstituted aromatic heterocyclic group having 5 to 40 ring atoms.

Examples of the aromatic hydrocarbon group include a phenyl group, biphenyl group, terphenyl group, naphthyl group, 9,9'-dimethylfluorene group and phenanthrene group.

Examples of the aromatic heterocyclic group include a monovalent residue of thiophene, a monovalent residue of benzothiophene, a monovalent residue of dibenzothiophene, a monovalent residue of furan, a monovalent residue of benzofuran and a monovalent residue of dibenzofuran.

In the formulae (2) to (7), $Ar_5$ to $Ar_{16}$ are a substituted or unsubstituted aromatic hydrocarbon group having 6 to 40 ring carbon atoms or a substituted or unsubstituted aromatic heterocyclic group having 5 to 40 ring atoms. Both of an aromatic hydrocarbon group having 8 to 40 ring carbon atoms which has an aromatic amino group as a substituent and may have another substituent and an aromatic hydrocarbon group having 8 to 40 ring atoms which has an aromatic heterocyclic group as a substituent and may have another substituent are preferable.

In the formulae (1) to (7), r1, r6 to r8, r11, r12, r19, r20 and r23 are an integer of 1 to 4; and r9, r10, r13 to r15, r18, r21 and r22 are an integer of 1 to 3.

In the formulae (1) to (7), $Ar_1$ to $Ar_{16}$ may be a ladder-type furan group.

In the formulae (1) to (7), each of combinations of $Ar_1$ and $Ar_e$, $Ar_a$ and $Ar_4$, $Ar_5$ and $Ar_6$, $Ar_8$ and $Ar_9$, $Ar_{10}$ and $Ar_{11}$, $Ar_{12}$ and $Ar_{13}$, and $Ar_{11}$ and $Ar_{16}$ may be mutually bonded to form a ring.

In the formulae (2), (4), (6) and (7), $L_1$ to $L_7$ are a single bond or a linking group having 1 to 30 carbon atoms.

Here, for instance, when $L_1$ is a single bond, an N atom and a phenylene ring are directly bonded to each other In the formulae (1) to (7), $R_1$ to $R_{23}$ are each independently a hydrogen atom, halogen atom, substituted or unsubstituted alkyl group having 1 to 40 carbon atoms, substituted or unsubstituted aromatic heterocyclic group having 5 to 40 ring atoms, substituted or unsubstituted aromatic hydrocarbon group having 6 to 40 ring carbon atoms, substituted or unsubstituted aralkyl group having 7 to 20 carbon atoms, substituted or unsubstituted alkenyl group having 2 to 40 carbon atoms, substituted or unsubstituted alkylamino group having 1 to 40 carbon atoms, substituted or unsubstituted aralkylamino group having 7 to 60 carbon atoms, substituted or unsubstituted alkylsilyl group having 3 to 20 carbon atoms, substituted or unsubstituted arylsilyl group having 8 to 40 carbon atoms, substituted or unsubstituted aralkylsilyl group having 8 to 40 carbon atoms, or substituted or unsubstituted halogenated alkyl group having 1 to 40 carbon atoms.

In the formulae (4), (6) and (7), $X_1$ to $X_6$ are each a sulfur atom, an oxygen atom, or a nitrogen atom substituted by a mono-aromatic hydrocarbon group.

In the formula (1), a phenylene group, which is directly bonded to a nitrogen atom directly bonded to $Ar_1$ and $Ar_2$, may be directly bonded to $Ar_1$ or $Ar_2$. In the formula (1), a phenylene group, which is directly bonded to a nitrogen atom directly bonded to $Ar_3$ and $Ar_4$, may be directly bonded to $Ar_3$ or $Ar_4$.

In the formula (1), $Ar_2$ and $Ar_3$ are preferably a fused aromatic hydrocarbon having 6 to 40 ring carbon atoms. $Ar_2$ and $Ar_3$ are more preferably a naphthyl group.

In the formula (2), a phenylene group, which is bonded via $L_1$ to a nitrogen atom directly bonded to $Ar_5$ and $Ar_6$, may be directly bonded to $Ar_5$ and $Ar_6$.

In the invention, "carbon atoms forming a ring (ring carbon atoms)" mean carbon atoms forming a saturated ring, an unsaturated ring, or an aromatic ring. "Atoms forming a ring (ring atoms)" mean carbon atoms and hetero atoms forming a hetero ring including a saturated ring, unsaturated ring, or aromatic ring.

An "aromatic hydrocarbon group" encompasses not only a non-fused aromatic hydrocarbon group but also a fused aromatic hydrocarbon group, unless otherwise specified. An "aromatic heterocyclic group" encompasses not only a non-fused aromatic heterocyclic group but also a fused aromatic heterocyclic group, unless otherwise specified.

Examples of a substituent which may be used in a case of being "substituted or unsubstituted" are an hydroxyl group, a nitro group and a carboxy group in addition to an aromatic hydrocarbon group, a heterocyclic group, an alkyl group (a linear or branched alkyl group, a cycloalkyl group and a halogenated alkyl group), an alkenyl group, an alkynyl group, an alkylsilyl group, an arylsilyl group, an alkoxy group, a halogenated alkoxy group, an aralkyl group, an aryloxy group, a halogen atom, and a cyano group as described above. Among the above substituents, the aromatic hydrocarbon group, heterocyclic group, alkyl group, halogen atom, alkylsilyl group, arylsilyl group and cyano group are preferable and the specific preferable substituents described in each of the substituents are further preferable. Moreover, the substituents may be further substituted by the above-described substituents.

"Unsubstituted" in the phrase "substituted or unsubstituted" means that a group is substituted by a hydrogen atom.

The same description as the above applies to "substituted or unsubstituted" in the following compound or a partial structure thereof In the invention, a hydrogen atom encompasses isotopes having different numbers of neutrons, specifically, protium, deuterium and tritium.

Among the amine derivatives represented by the formulae (1) to (7), the amine derivatives represented by the formulae (2) to (4) and (6) to (7) are preferable, in which a compound having a carbazolyl group is preferable. The amine derivative is exemplified by the following compounds.

[Formula 3]

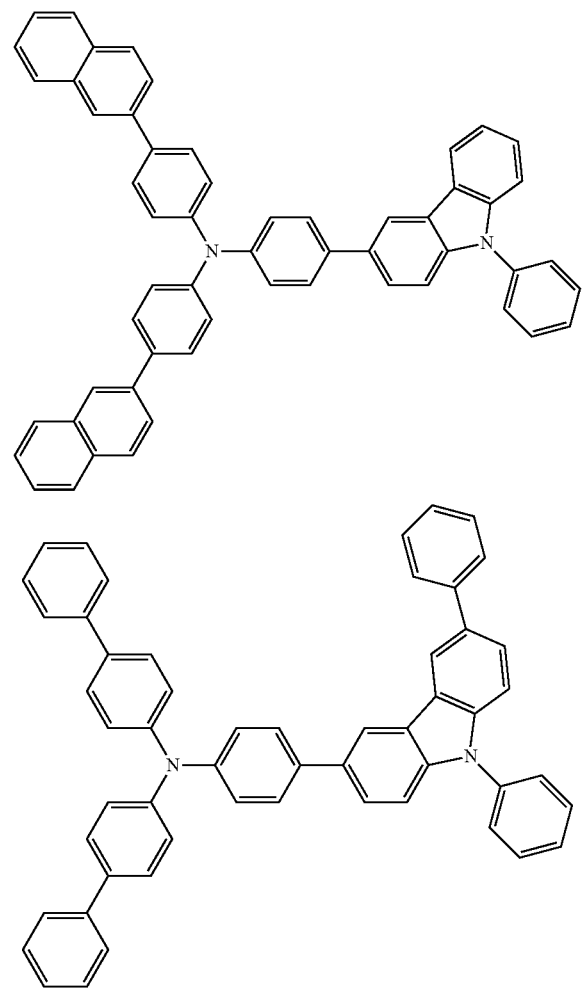

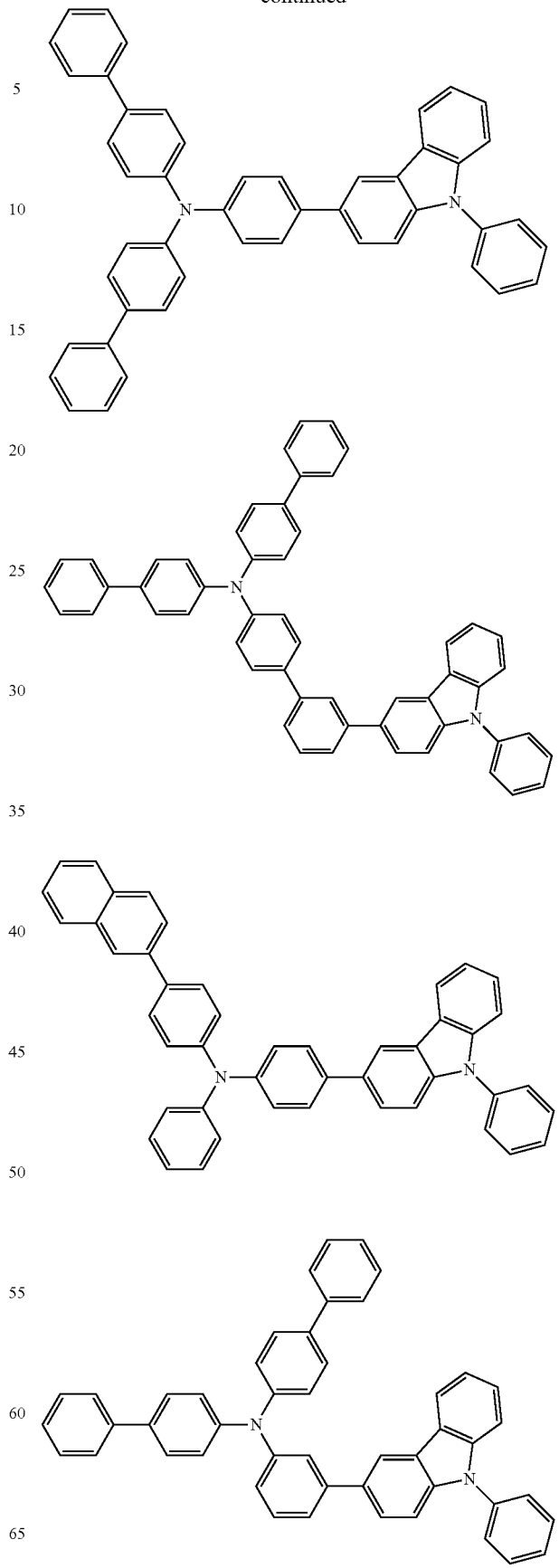

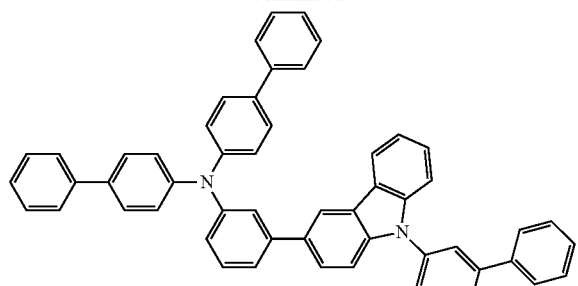
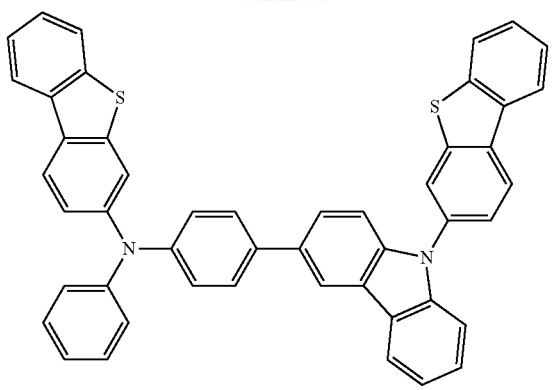
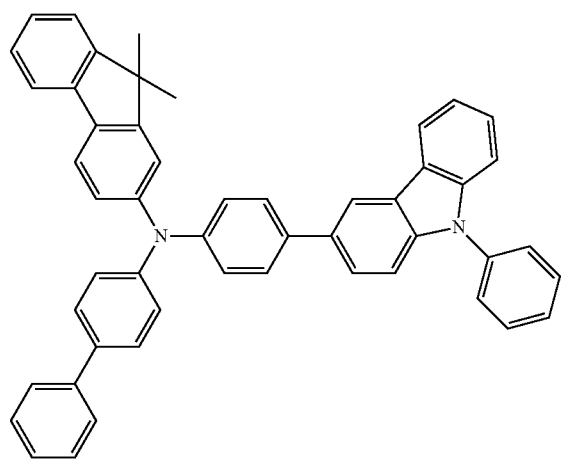
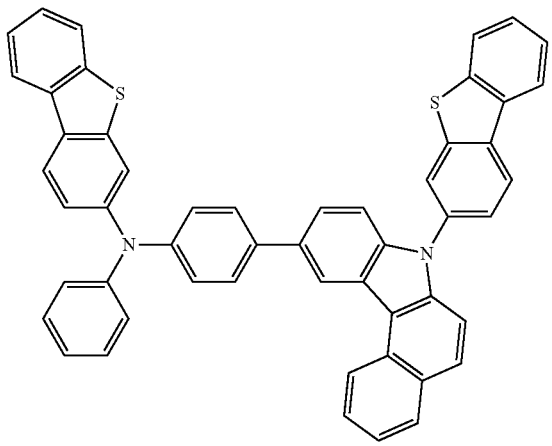
[Formula 4]
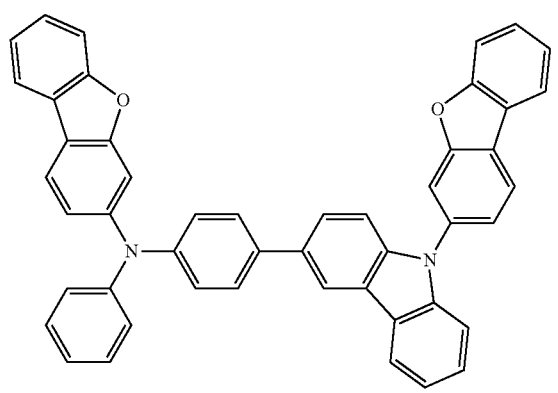
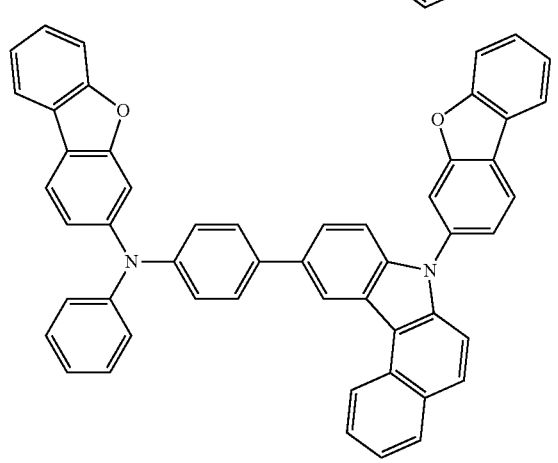
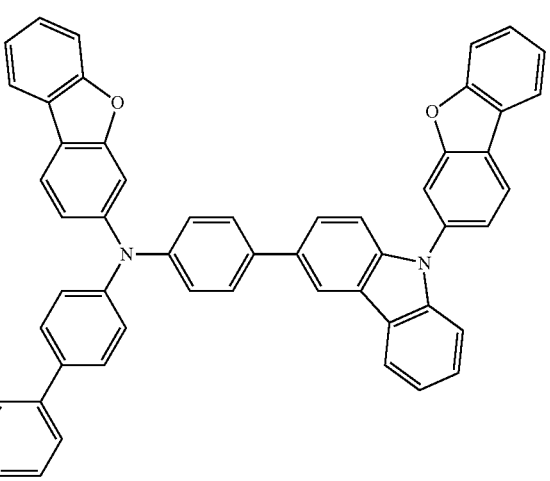

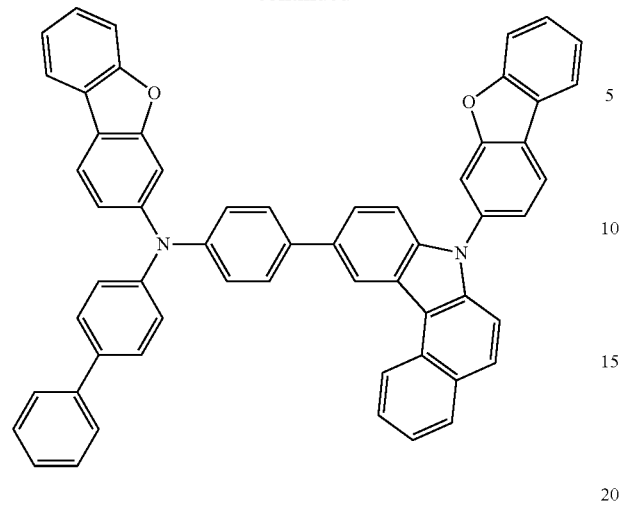
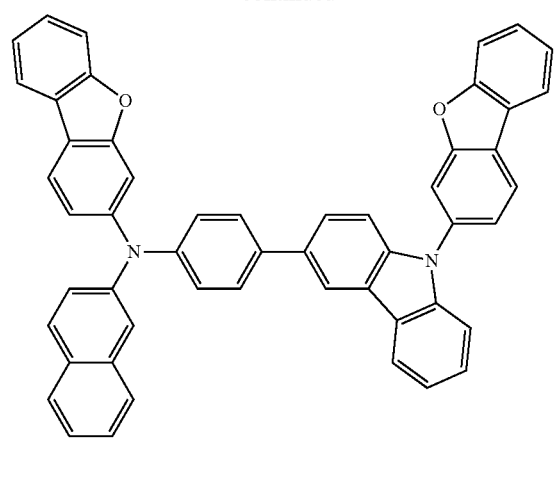
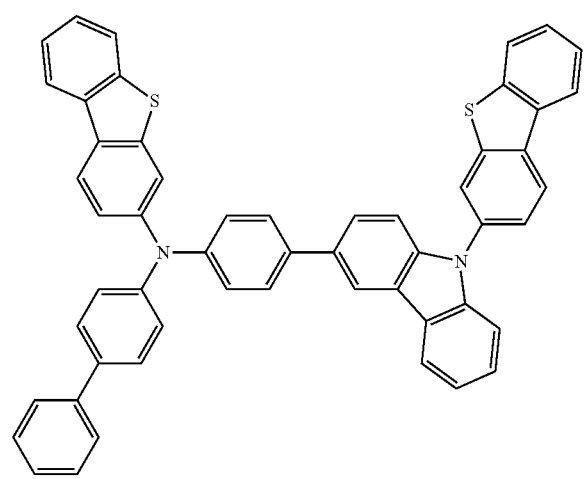
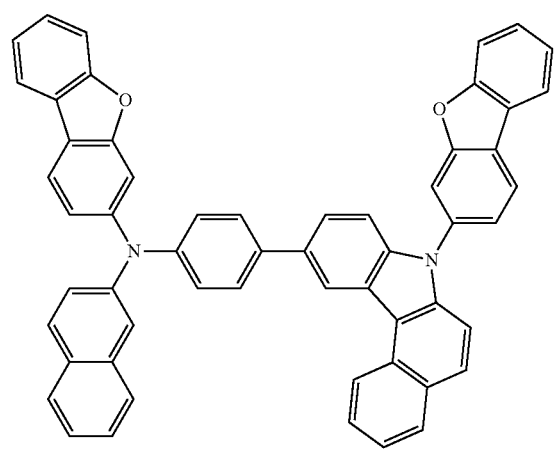
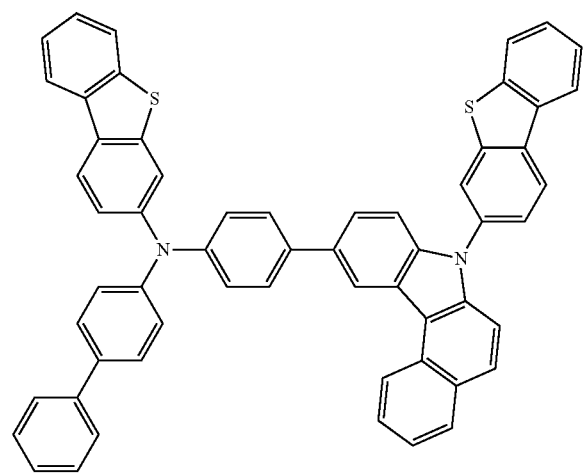
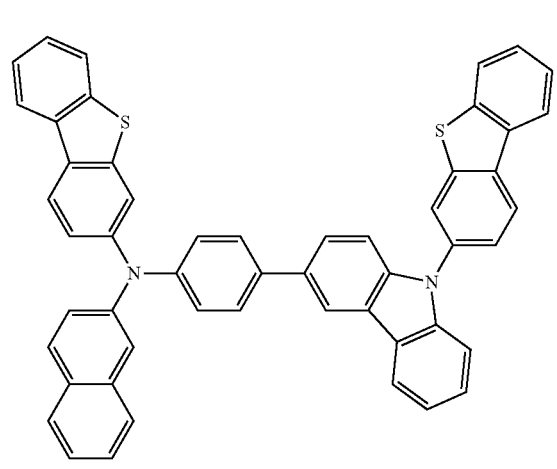

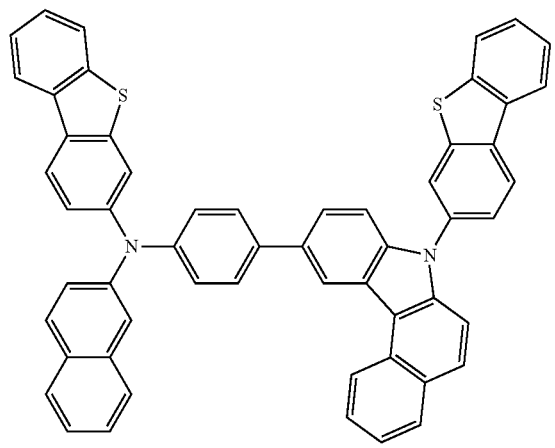
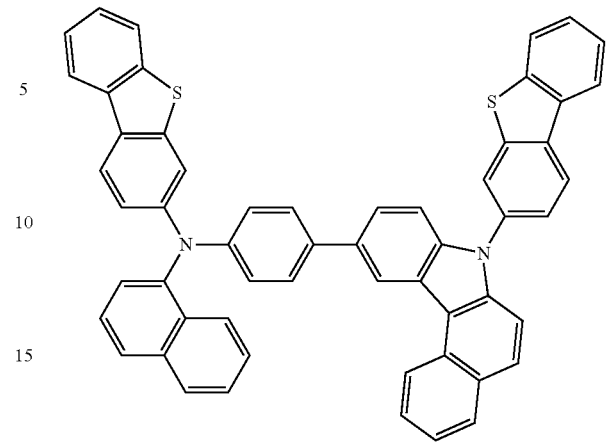
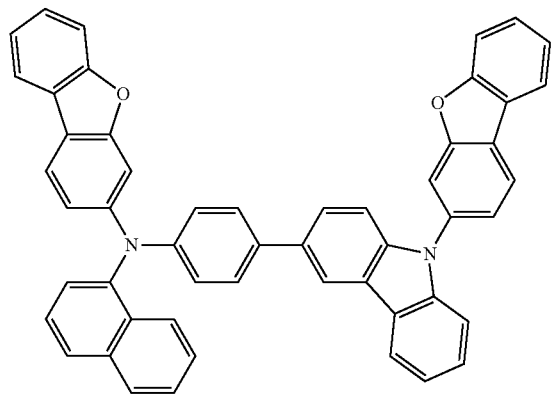
[Formula 5]
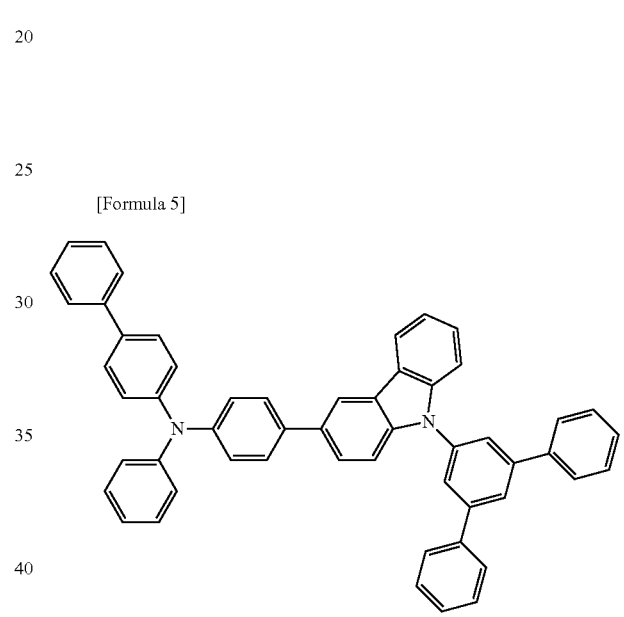
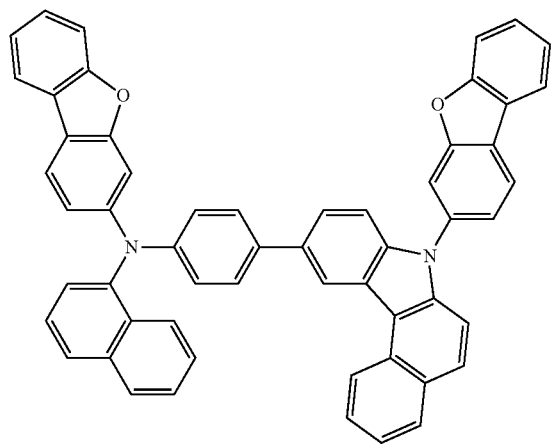
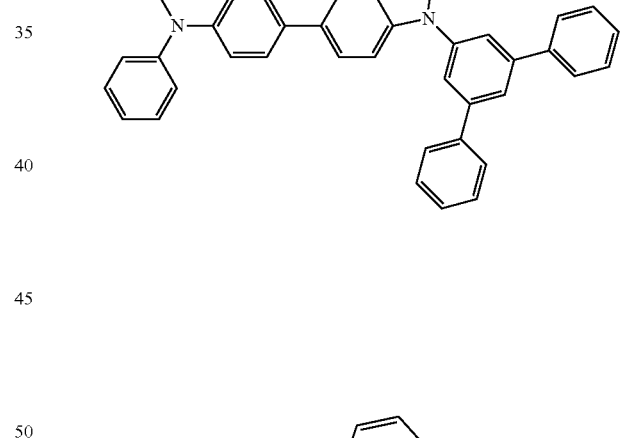
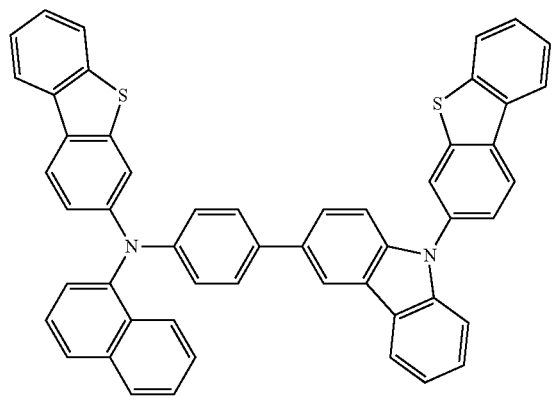
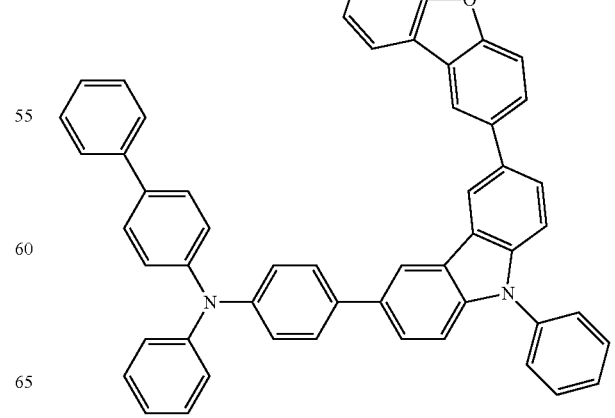

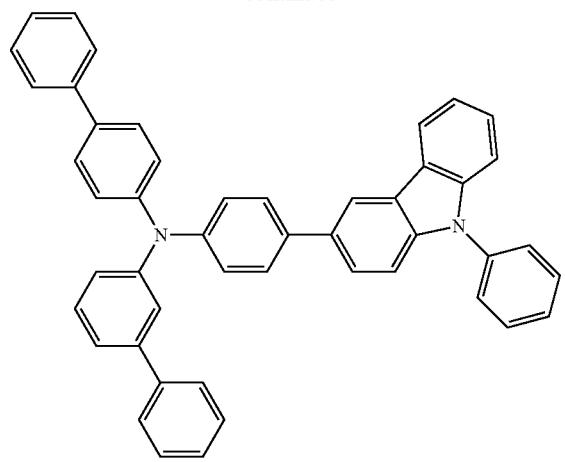
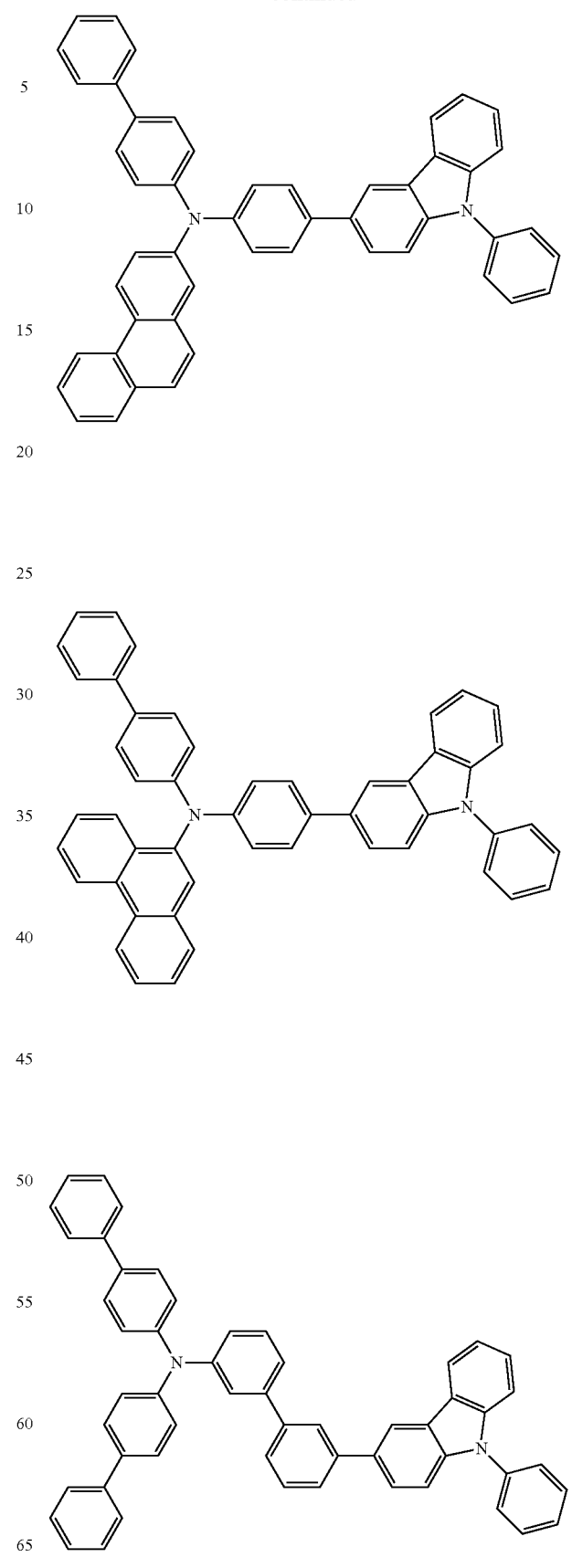

[Formula 6]
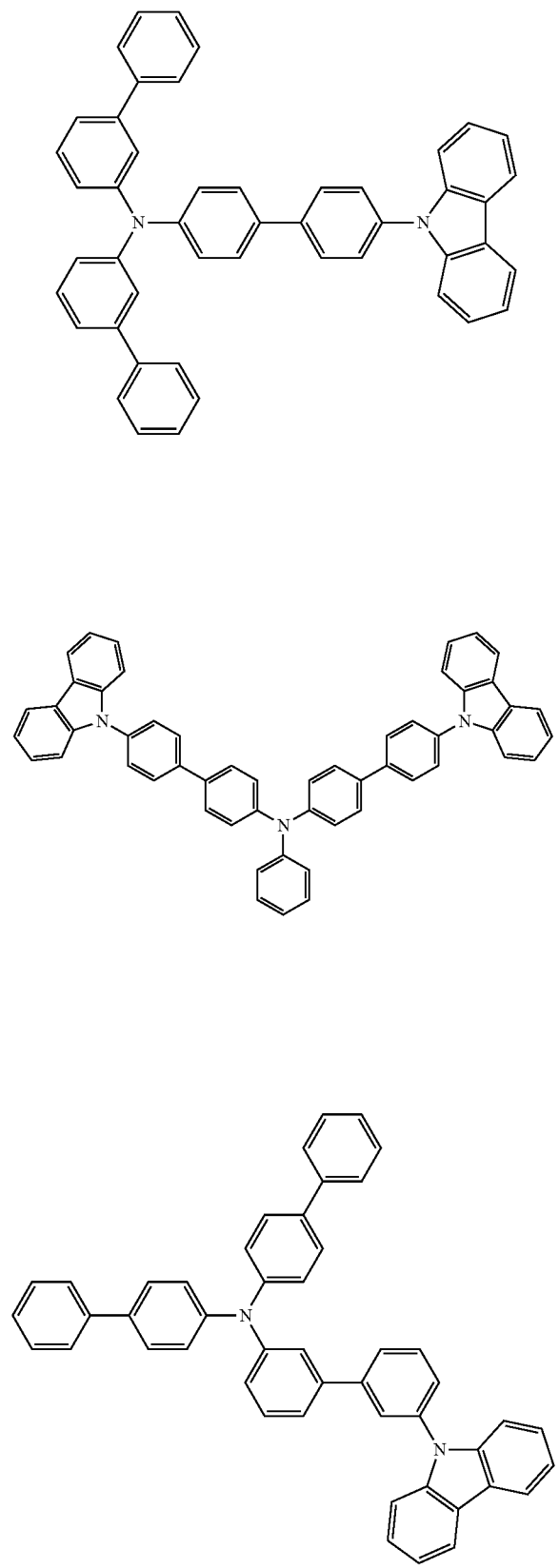
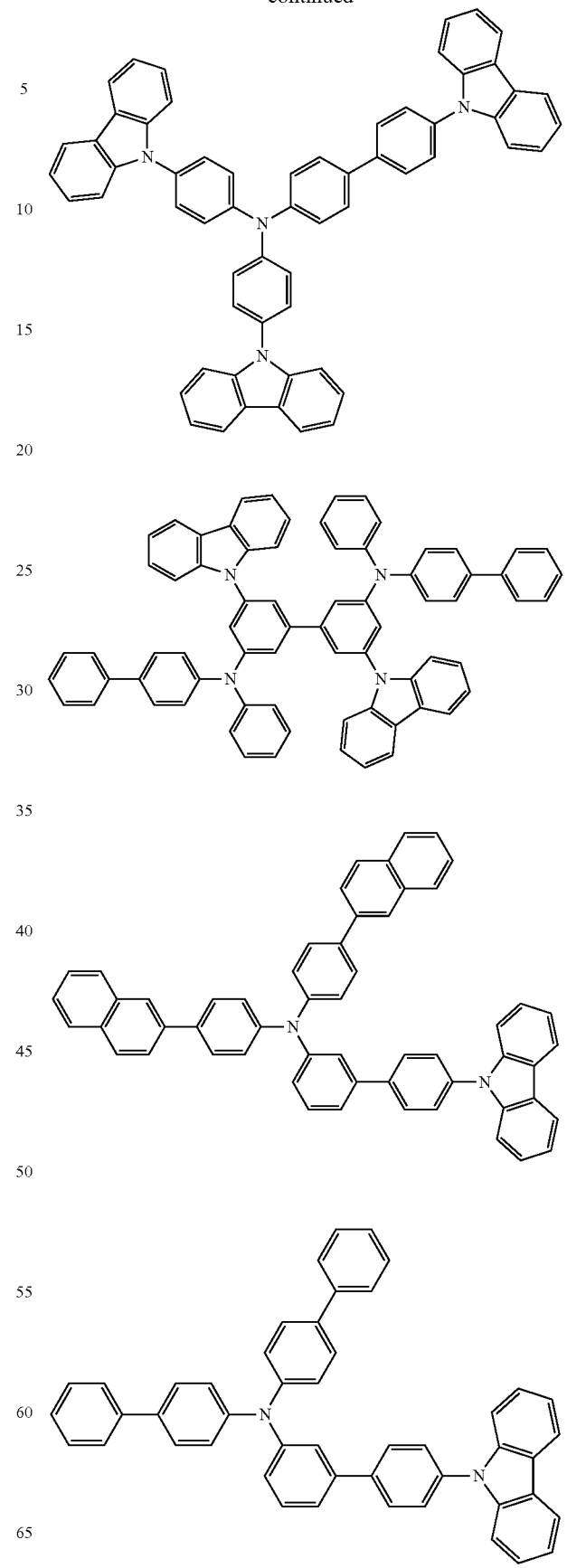

-continued
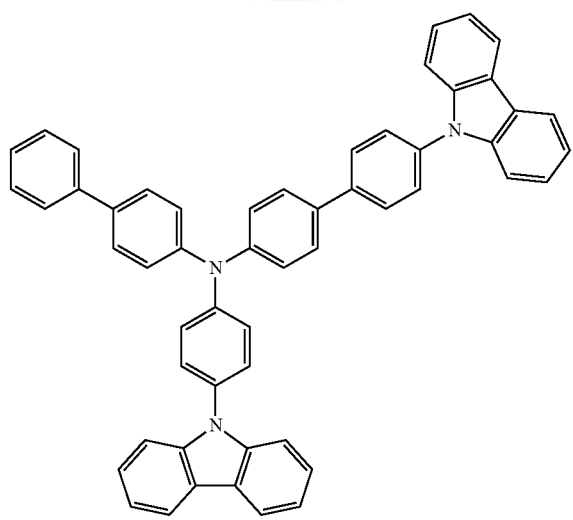
[Formula 7]
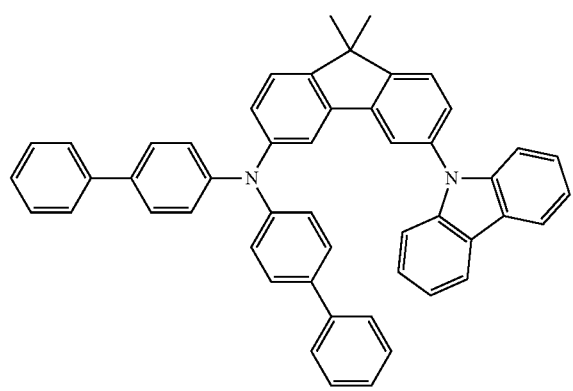
-continued
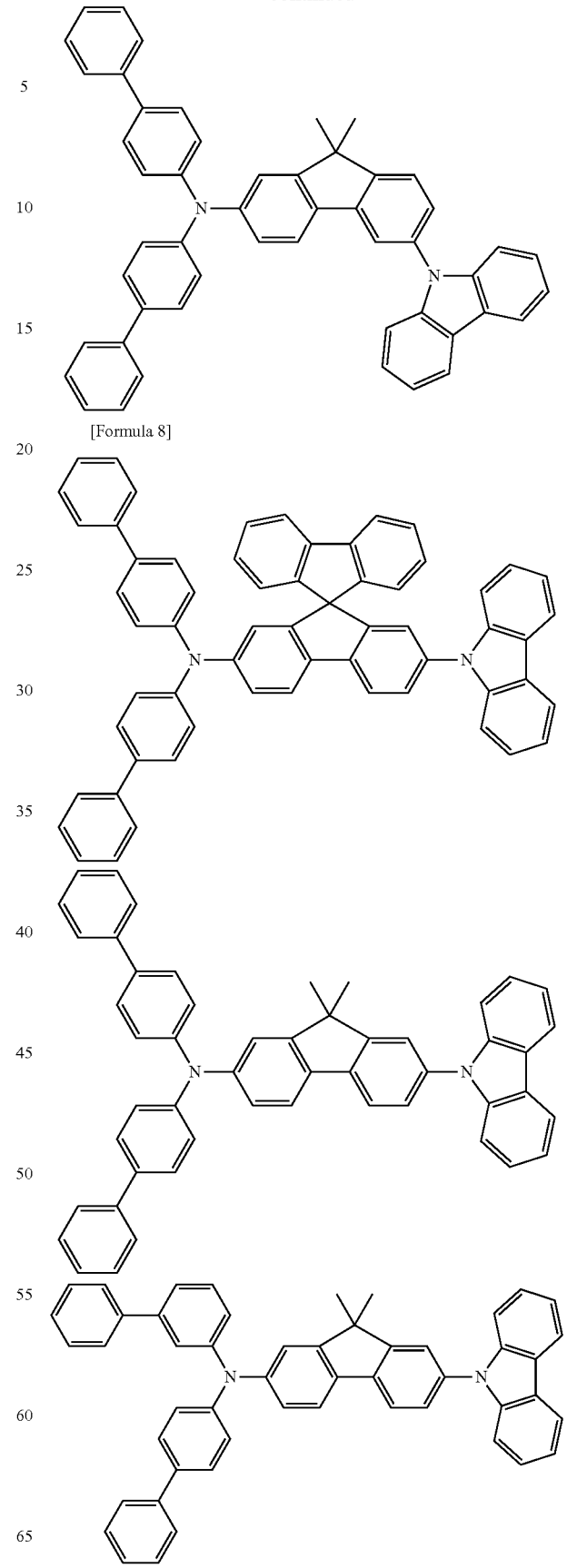
[Formula 8]

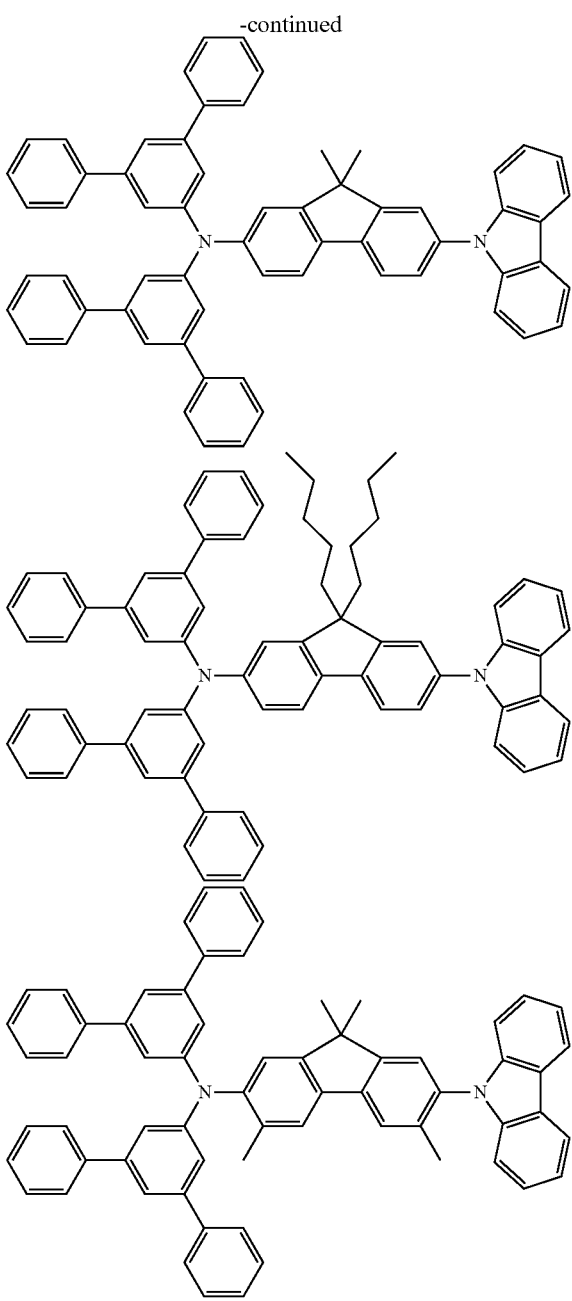

A compound having a fused aromatic ring is exemplified by a compound in which a substituted or unsubstituted fused aromatic ring is connected to a substituted or unsubstituted aromatic ring.

The compound having a fused aromatic ring is preferably a compound selected from the group consisting of polycyclic aromatic compounds represented by formulae (10A), (10B) and (10C) below.

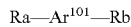  (10A)

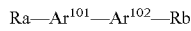  (10B)

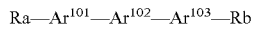  (10C)

In the formulae (10A) to (10C), $Ar^{101}$, $Ar^{102}$, $Ar^{103}$, Ra and Rb are a substituted or unsubstituted aromatic hydrocarbon group having 6 to 60 ring carbon atoms.

$Ar^{101}$, $Ar^{102}$, $Ar^{103}$, Ra and Rb preferably represent a polycyclic aromatic skeleton selected from a substituted or unsubstituted benzene ring, a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring, a substituted or unsubstituted fluorene ring, and a substituted or unsubstituted aromatic picene ring.

Further, it is preferable that a substituent for each of Ra and Rb is not an aromatic hydrocarbon group and that $Ar^{101}$, $Ar^{102}$, $Ar^{103}$, Ra and Rb are not substituted or unsubstituted benzene ring at the same time.

Moreover, in the formulae (10A) to (10C), one or both of Ra and Rb are preferably selected from the group consisting of a substituted or unsubstituted phenanthrene ring, substituted or unsubstituted benzo[c]phenanthrene ring, substituted or unsubstituted triphenylene ring and substituted or unsubstituted fluoranthene ring.

The compound having a fused aromatic ring may be a compound in which a substituted or unsubstituted fused aromatic ring is connected to a substituted or unsubstituted fused aromatic heterocyclic ring.

The fused aromatic heterocyclic ring is exemplified by a carbazole ring and a dibenzofuran ring.

Specific examples of the compound having the fused aromatic ring are compounds below.

[Formula 9]

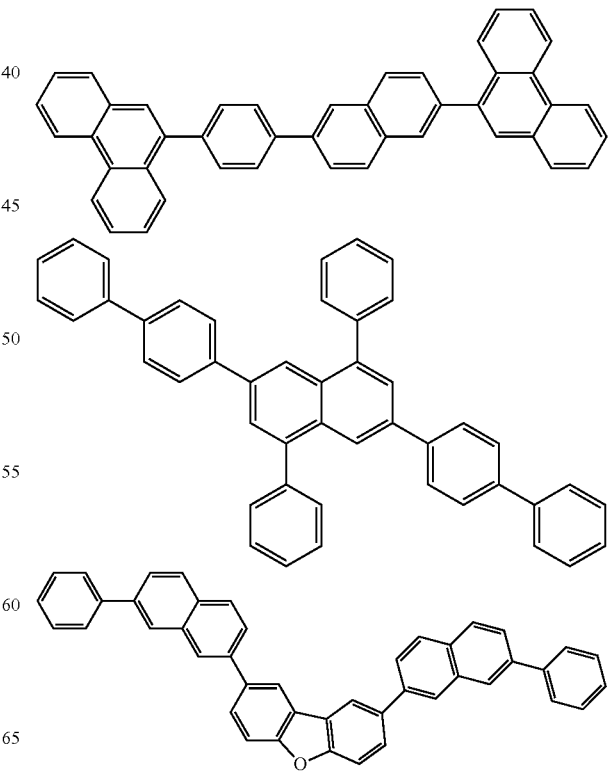

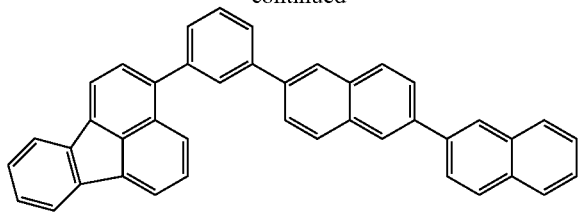
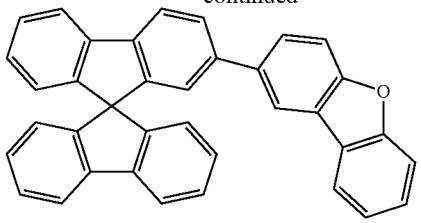
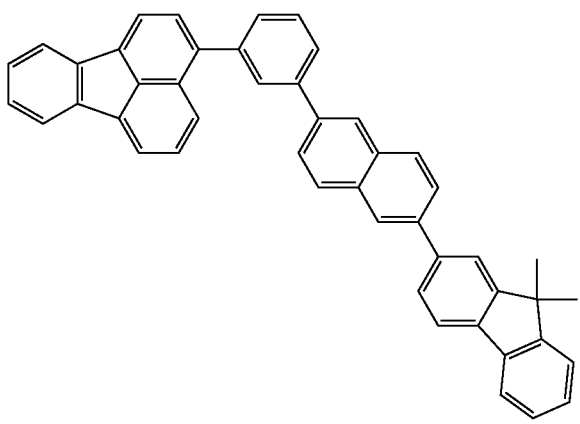
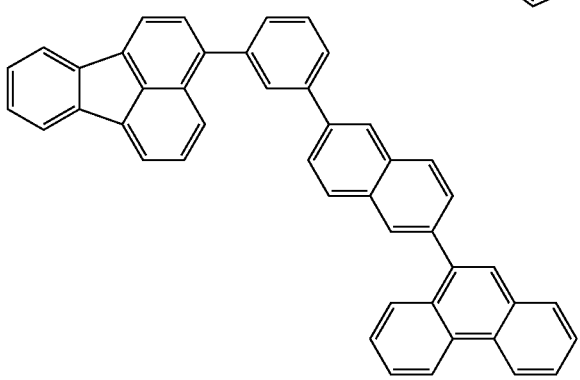
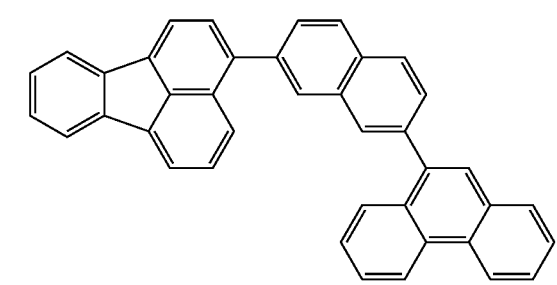
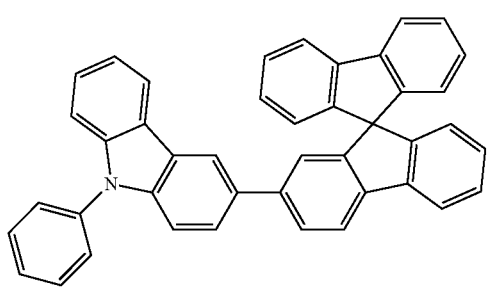

Triplet energy (Eg(T)) of the first host material is preferably 2.4 eV or more, more preferably 2.5 eV or more. When the triplet energy of the first host material is 2.4 eV or more, the triplet energy of the first host material can be made larger than the triplet energy of the first dopant material. With this arrangement, the triplet energy of the first dopant material can be prevented from diffusing over the first host material and the like, thereby improving luminous efficiency and the like.

On the other hand, the triplet energy (Eg(T)) of the first host material is preferably smaller than triplet energy (Eg(T)) of a hole transporting material of the hole transporting layer 6 adjacent to the first emitting layer 51. With this arrangement, triplet energy can be prevented from diffusing over the hole transporting layer 6 adjacent to the first emitting layer 51, thereby improving luminous efficiency and the like.

In the invention, triplet energy refers to an energy gap between the lowest triplet state and the ground state.

Further, a difference between Ip (ionization potential) of the first host material and Ip of the material for the hole transporting layer 6 adjacent to the first emitting layer 51 is preferably 0.2 eV or less, more preferably 0.15 eV or less, particularly preferably 0.10 eV or less. When the difference between Ip of the first host material and Ip of the material for the hole transporting layer 6 is 0.2 eV or less, hole transporting performance from the hole transporting layer 6 to the first emitting layer 51 becomes favorable, so that holes flowing into the first emitting layer 51 and the second emitting layer 52 can be increased.

First Dopant Material

The first dopant material, which is a phosphorescent material, is preferably a metal complex. The metal complex preferably includes at least one of iridium (Ir), palladium (Pd) and platinum (Pt). The metal complex is further preferably an ortho-metalated complex represented by the following formula (20).

[Formula 10]

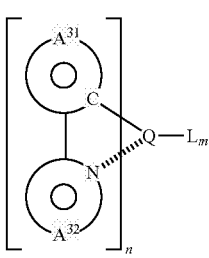

(20)

In the formula (20), $Ar^{31}$ is a ring bonded to $Ar^{32}$ and Q and is a substituted or unsubstituted aromatic hydrocarbon group or a substituted or unsubstituted aromatic heterocyclic group.

Preferable examples of the aromatic hydrocarbon group are a phenyl group, a biphenyl group, a naphthyl group and an anthryl group.

Preferable examples of the aromatic heterocyclic group are a thienyl group, a pyridyl group, a quinolyl group and an isoquinolyl group.

Preferable examples of a substituent for the aromatic hydrocarbon group or the aromatic heterocyclic group are a halogen atom, an alkyl group having 1 to 30 carbon atoms, an alkenyl group, an alkoxycarbonyl group having 1 to 30 carbon atoms, an alkoxy group having 1 to 30 carbon atoms, an aryloxy group, an dialkylamino group, an haloalkyl group and an cyano group.

A preferable example of the halogen atom is a fluorine atom.

Preferable examples of the alkyl group having 1 to 30 carbon atoms are a methyl group and an ethyl group.

A preferable example of the alkenyl group is a vinyl group.

Preferable examples of the alkoxycarbonyl group having 1 to 30 carbon atoms are a methoxycarbonyl group and an ethoxycarbonyl group.

Preferable examples of the alkoxy group having 1 to 30 carbon atoms are a methoxy group and an ethoxy group.

Preferable examples of the aryloxy group are a phenoxy group and a benzyloxy group.

Preferable examples of the dialkylamino group are a dimethylamino group and a diethylamino group.

A preferable example of the acyl group is an acetyl group.

A preferable example of the haloalkyl group is a trifluoromethyl group. $A^{32}$, which is an aromatic heterocyclic group bonded to $A^{31}$, contains nitrogen as an atom for forming the aromatic heterocyclic group and may have a substituent.

Preferable examples of the aromatic heterocyclic group are a pyridyl group, pyrimidyl group, pyrazine group, triazine group, benzothiazole group, benzooxazole group, benzimidazole group, quinolyl group, isoquinolyl group, quinoxaline group and phenanthridine group.

The substituent for $A^{32}$ is the same as the substituent for $A^{31}$.

A ring including $A^{31}$ and a ring including $A^{32}$ may be bonded to each other at portions other than $A^{31}$ and $A^{32}$ to combine cyclic structures, thereby forming a fused ring or an unsaturated structure. Such a fused ring is exemplified by 7,8-benzoquinoline group.

Q is one of palladium (Pd), iridium (Ir) and platinum (Pt).

L is a bidentate ligand. Preferable examples of the bidentate ligand are a β-diketo ligand (e.g., acetylacetonato) and pyromellitic acid.

In the formula (20), m and n represent an integer. When Q is a divalent metal, n=2 and m=0. When Q is a trivalent metal, n=3 and m=0, or n=2 and m=1.

The ortho-metalated complex represented by the formula (20) is exemplified by compounds below.

[Formula 11]

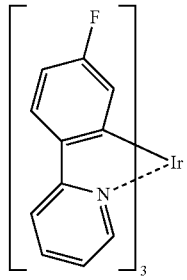

(K-1)

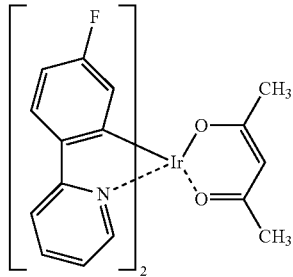

(K-2)

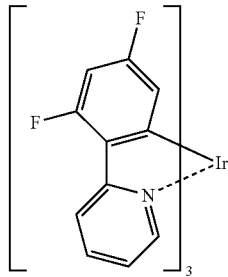

(K-3)

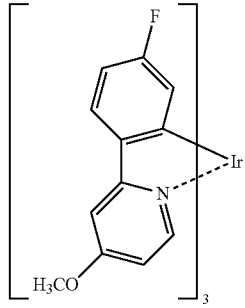

(K-4)

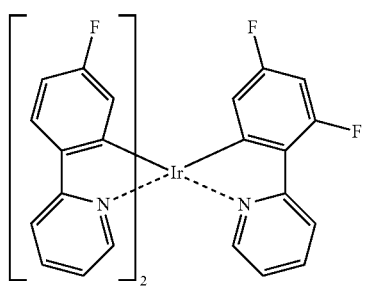

(K-5)

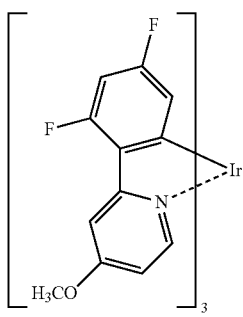
(K-6)
[Formula 12]
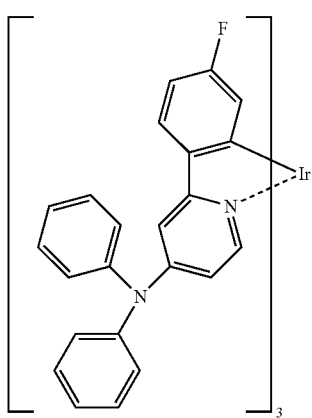
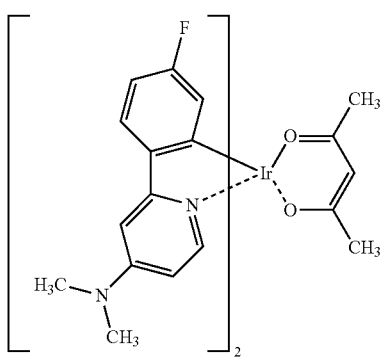
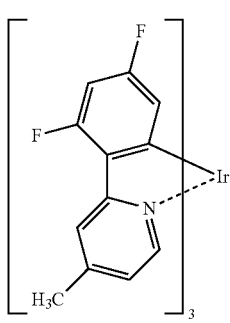
(K-9)
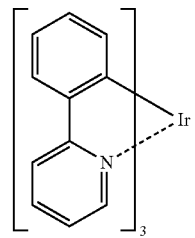
(K-10)
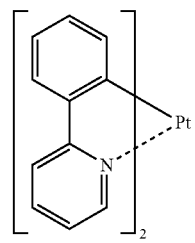
(K-11)
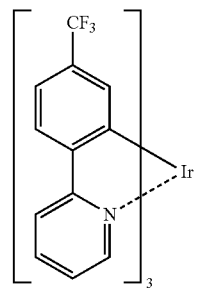
(K-12)
[Formula 13]
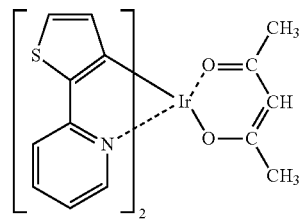
(K-13)
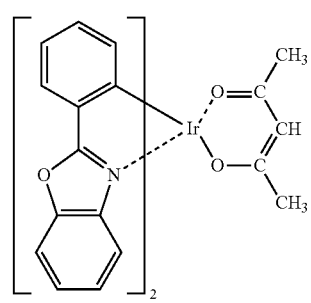
(K-14)
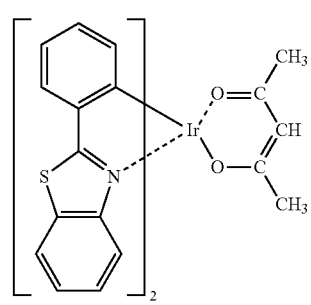
(K-15)

(K-16)
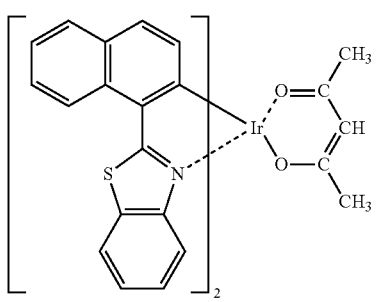
(K-17)
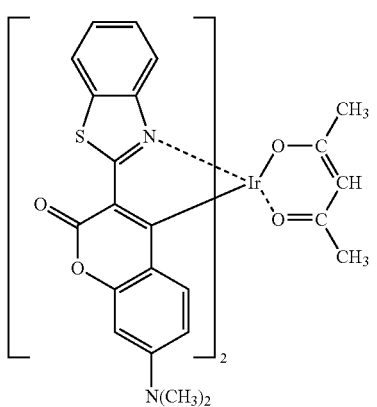
[Formula 14]
(K-18)
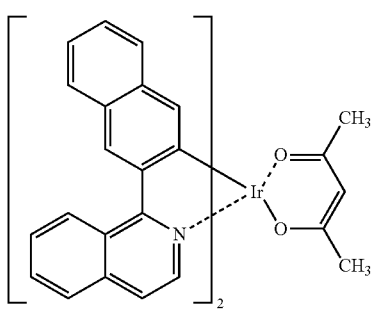
(K-19)
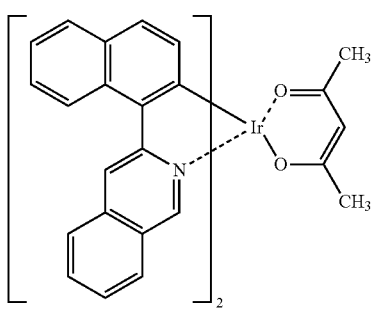
(K-20)
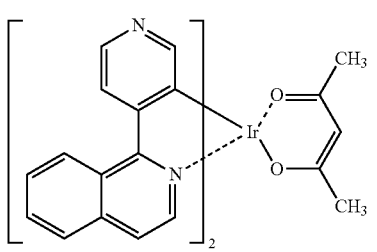
(K-21)
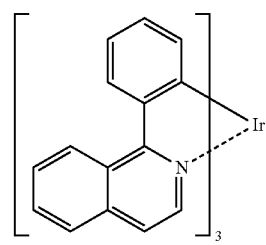
(K-22)
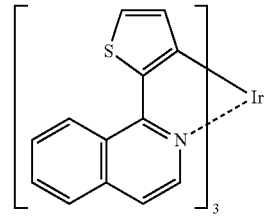
(K-23)
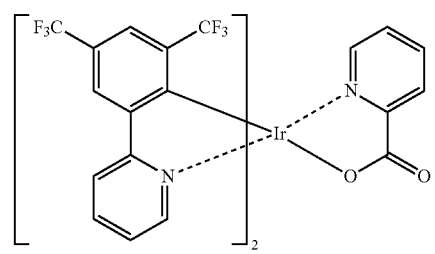
(K-24)
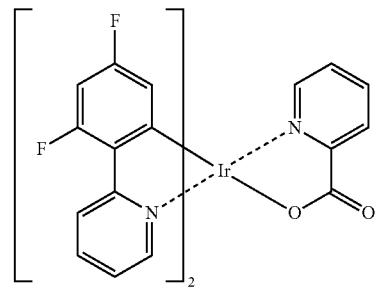
(K-25)
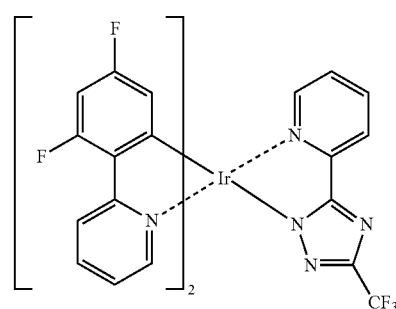
[Formula 15]
(K-26)
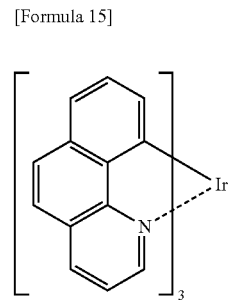

[Formula 16]

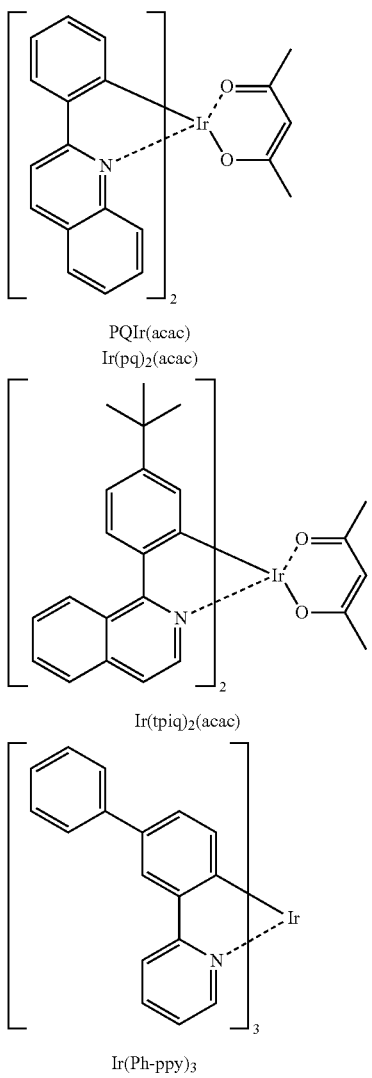

PQIr(acac)
Ir(pq)₂(acac)

Ir(tpiq)₂(acac)

Ir(Ph-ppy)₃

In the exemplary embodiment, the first dopant material preferably exhibits a luminescence peak of 570 nm or more. The luminescence peak of 570 nm or more is shown by, for instance, red emission. Specifically, the above compounds (K-15) to (K-22), Ir(pq)₂(acac) and Ir(tpiq)₂(acac) are preferable.

Second Emitting Layer

The second emitting layer contains a second host material, a third host material, and a second dopant material.

Relationship Between First Host Material and Second Host Material

In order to obtain emissions from both of the first emitting layer and the second emitting layer, an electron transporting host material is preferably used as the second host material of the second emitting layer.

The second host material preferably has larger affinity and ionization potential than the first host material. When the second host material has a larger affinity than the first host material, the first emitting layer 51 can function as an electron blocking layer due to the difference in the affinity. When the second host material has a larger ionization potential than the first host material, the second emitting layer 52 can also function as a hole blocking layer due to the difference in ionization potential.

Consequently, excitons can be favorably generated near the interface between the first emitting layer 51 and the second emitting layer 52, thereby avoiding color shift even when a luminance intensity is increased.

Here, an affinity Af (i.e. electron affinity) refers to ejected or absorbed energy when an electron is given to a molecule of a material, which is defined to be positive in the case of ejection and negative in the case of absorption.

The affinity is defined as follows, with use of ionization potential (Ip) and singlet energy (Eg(S)) (an energy gap between the lowest singlet state and the ground state).

$$Af = Ip - Eg(S)$$

Here, the ionization potential Ip refers to energy necessary for a compound of the host material to remove electrons to ionize, for which a value measured with an ultraviolet ray photoelectron spectrometer (AC-3 manufactured by Riken Keiki Co., Ltd.).

The singlet energy (Eg(S)) refers to a difference in optical energy between conductive level and covalent electron level and is calculated by, for example, converting into an energy value a wavelength value at an intersection of the tangent line adjacent to a long wavelength of an absorption spectrum and a base line (no absorption) in a solution in which each host material is dissolved in toluene.

Relationship Between Second Host Material and Third Host Material

The second host material and the third host material preferably satisfy a formula (N-1) below and at least one of formulae (N-2) and (N-3) below.

$$Af_{H2} \geq Af_{H3} \tag{N-1}$$

$$\mu(e)_{H2} > \mu(e)_{H3} \tag{N-2}$$

$$Eg(S)_{H2} < Eg(S)_{H3} \tag{N-3}$$

In the formula (N-1), $Af_{H2}$ is an affinity of the second host material and $Af_{H3}$ is an affinity of the third host material. In the formula (N-2), $\mu(e)_{H2}$ is an electron mobility of the second host material and $\mu(e)_{H3}$ is an electron mobility of the third host material. In the formula (N-3), $Eg(S)_{H2}$ is singlet energy of the second host material and $Eg(S)_{H3}$ is singlet energy of the third host material.

In order to obtain a desired chromaticity of the organic EL device, it is only necessary to adjust the respective luminous intensities of the first emitting layer and the second emitting layer while the first emitting layer and the second emitting layer emit light.

For instance, in order to decrease the luminous intensity of the first emitting layer and increase the luminous intensity of the second emitting layer, it is necessary to shift a recombination zone of holes and electrons toward the second emitting layer. The recombination zone can be shifted toward the second emitting layer by reducing electron injection to the second emitting layer.

In the second emitting layer of the exemplary embodiment, the affinity $Af_{H3}$ of the third host material is preferably equal to or less than the affinity $Af_{H2}$ of the second host material as shown in the formula (N-1). In other words, the third host material preferably hinders electron injection to the second host material.

The recombination zone can also be shifted toward the second emitting layer by reducing electron transporting performance of the second emitting layer. In order to weaken the electron transporting performance of the second emitting layer, it is only necessary to appropriately add the third host material having a lower electron mobility than the second host material (i.e., the third host material satisfying the formula (N-2)) to the second emitting layer. By thus adding the third host material satisfying the formula (N-1) and the formula (N-2) to the second emitting layer, the luminous intensity of each of the emitting layers can be adjusted without changing the film thickness and the dopant concentration of each of the emitting layers, so that an organic EL device having a desired chromaticity can be obtained.

Moreover, the recombination zone can also be shifted toward the second emitting layer by appropriately adding to the second emitting layer the third host material having a larger singlet energy than the second host material and serving as a significant barrier to carriers (i.e., the third host material satisfying the formula (N-3)). By thus adding the third host material satisfying the formula (N-1) and the formula (N-3) to the second emitting layer, the luminous intensity of each of the emitting layers can be adjusted without changing the film thickness and the dopant concentration of each of the emitting layers, so that an organic EL device having a desired chromaticity can be obtained.

Further, singlet energy $Eg(S)_{H2}$ of the second host material and singlet energy $Eg(S)_{H3}$ of the third host material preferably satisfy a formula (N-31) below.

$$\Delta Eg(S)=Eg(S)_{H3}-Eg(S)_{H2}>0.2 \text{ (eV)} \quad (N\text{-}31)$$

Moreover, electron mobility $\mu(e)_{H2}$ of the second host material and electron mobility $\mu(e)_{H3}$ of the third host material preferably satisfy a formula (N-21) below.

$$\Delta\mu(e)=\mu(e)_{H2}/\mu(e)_{H3}>10^2 \quad (N\text{-}21)$$

Further, in the second emitting layer, with increase in the third host material, electrons flowing in the third host material are increased to weaken the electron transporting performance of the second host material. Specifically, since the electron transporting performance of the second host material is affected by the concentration of the third host material, the electron transporting performance of the second host material can be changed by changing a mass of the third host material (i.e., the concentration of the third host material) relative to the total mass of the second host material and the third host material, whereby the chromaticity of the organic EL device can be adjusted.

As a measuring method of the mobility, some methods such as Time of Flight method are known. Herein, the mobility is determined by the impedance spectroscopy.

Next, the measurement of the mobility by the impedance spectroscopy will be described below. A target material for the mobility measurement having a thickness of approximately 100 nm to 200 nm is held between the anode and the cathode. While applying a bias DC voltage, a small alternate voltage of 100 mV or less is applied. The value of an alternate current (the absolute value and the phase) which flows at this time is measured. This measurement is performed while changing the frequency of the alternate voltage, and complex impedance (Z) is calculated from a current value and a voltage value. A frequency dependency of the imaginary part (ImM) of the modulus $M=i\omega Z$ (i: imaginary unit, co: angular frequency) is obtained. The reciprocal number of a frequency ω at which the ImM becomes the maximum is defined as a response time of electrons carried in a layer of the target material. The mobility is calculated according to the following equation.

Mobility=(film thickness of the target material layer)$^2$/(response time×voltage)

Relationship Among First Host Material, Second Host Material and Third Host Material Relative to the electron mobility $\mu(e)_{H1}$ of the first host material of the first emitting layer, the electron mobility $\mu(e)_{H2}$ of the second host material and the electron mobility $\mu(e)_{H3}$ of the third host material preferably satisfy a formula (N-4) below.

$$\mu(e)_{H2}\geq\mu(e)_{H3}>\mu(e)_{H1} \quad (N\text{-}4)$$

As described above, it is preferable to use a hole transporting host material in the first emitting layer and an electron transporting host material in the second emitting layer in order to obtain emissions from both of the first emitting layer and the second emitting layer. In this organic EL device, for instance, in order to decrease the luminous intensity of the first emitting layer and increase the luminous intensity of the second emitting layer, it is only necessary to use the third host material having a higher electron mobility than the first host material and having a lower electron mobility than the second host material to weaken the electron transporting performance of the second emitting layer.

When hole mobility $\mu(h)_{H1}$ of the first host material is $10^{-6}$ cm$^2$/Vs or more, the ionization potential $Ip_{H1}$ of the first host material and the ionization potential $Ip_{H3}$ of the third host material preferably satisfy a formula (N-5) below.

$$Ip_{H1}<Ip_{H3} \quad (N\text{-}5)$$

In this case, since hole transporting performance of the first host material is high, it is expected that a requisite performance of the third host material is to control the hole transporting performance. On the other hand, the second host material desirably has hole transporting performance.

The first host material having the hole mobility $\mu(h)_{H1}$ of $10^{-6}$ cm$^2$/Vs or more is exemplified by the above-described amine derivative.

When the hole mobility $\mu(h)_{H1}$ of the first host material is less than $10^{-6}$ cm$^2$/Vs, the affinity $Af_{H1}$ of the first host material and the affinity $Af_{H3}$ of the third host material preferably satisfy a formula (N-6) below.

$$Af_{H1}>Af_{H3} \quad (N\text{-}6)$$

In this case, a requisite performance of the third host material is to control electrons from the second host material to the first host material. Accordingly, the third host material is desirably a compound having electron blocking performance, in other words, having a small affinity.

The first host material having the hole mobility $\mu(h)_{H1}$ of less than $10^{-6}$ cm$^2$/Vs is exemplified by the above-described compound having the fused aromatic ring.

Second Host Material

In the exemplary embodiment, the second host material is preferably an azine derivative. The azine derivative means a six-membered ring compound containing one or more nitrogen atoms in atoms for forming a ring (also referred to as a nitrogen-containing six-membered heterocyclic group). The azine derivative is preferably one of a monoazine derivative, a diazine derivative and a triazine derivative.

Since the second host material is one of the monoazine derivative, the diazine derivative and the triazine derivative, the second host material exhibits an excellent electron transporting performance from the electron transporting layer 7 to the first emitting layer 51.

The second host material is preferably compounds represented by formulae (21) to (26) below.

[Formula 17]

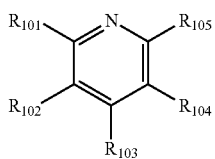 (21)

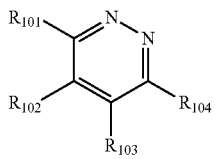 (22)

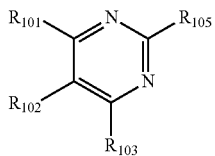 (23)

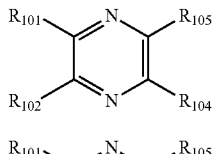 (24)

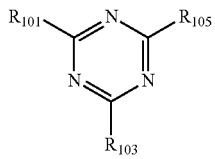 (25)

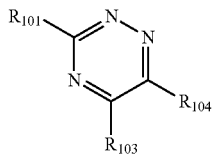 (26)

In the formulae (21) to (26), $R_{101}$ to $R_{105}$ are each a substituted or unsubstituted aromatic hydrocarbon group, a substituted or unsubstituted heterocyclic group, or an alkyl group.

The substituent for the aromatic hydrocarbon group are preferably an aromatic hydrocarbon group having 6 to 30 ring carbon atoms, a heterocyclic group having 5 to 30 carbon atoms and an alkyl group having 1 to 20 carbon atoms.

The substituent for the heterocyclic group are preferably an aromatic hydrocarbon group having 6 to 30 ring carbon atoms, a heterocyclic group having 5 to 30 carbon atoms and an alkyl group having 1 to 20 carbon atoms.

The second host material is preferably a compound having a carbazole skeleton. With the second host material having a carbazole skeleton, the organic EL device 1 exhibiting an excellent durability without color shift can be obtained.

The second host material having a carbazole skeleton is exemplified by a compound (carbazole azine compound) represented by the a formula (BL-9) or (BL-10) below.

[Formula 18]

$(Cz-)_mA$ (BL-9)

In the formula (BL-9), Cz is a substituted or unsubstituted carbazolyl group or a substituted or unsubstituted azacarbazolyl group. A is a group of one of a monoazine derivative, a diazine derivative and a triazine derivative. m is an integer of 1 to 3.

[Formula 19]

$Cz-A_n$ (BL-10)

In the formula (BL-10), Cz is a substituted or unsubstituted carbazolyl group or a substituted or unsubstituted azacarbazolyl group. A is a group of one of a monoazine derivative, a diazine derivative and a triazine derivative. n is an integer of 1 to 3.

The second host material having a carbazole skeleton is preferably a compound represented by a formula (27) or (28).

[Formula 20]

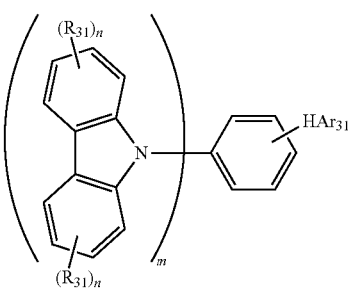 (27)

In the formula (27), $HAr_{31}$ is a substituted or unsubstituted nitrogen-containing six-membered heterocyclic group. m is an integer of 1 to 4, preferably 1 to 3, more preferably 1 or 2. n is an integer of 1 to 4. $R_{31}$ is a substituted or unsubstituted alkyl group or a substituted or unsubstituted aromatic hydrocarbon group. When $R_{31}$ is a substituted or unsubstituted aromatic hydrocarbon group, $R_{31}$ may be bonded to another $R_{31}$ to form a fused cyclic structure in which benzene rings are fused.

[Formula 21]

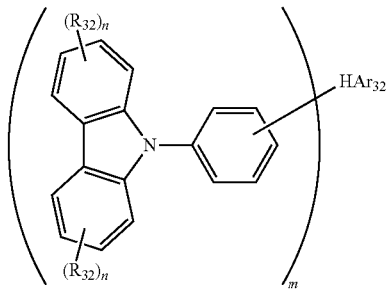 (28)

In the formula (28), $HAr_{32}$ is a substituted or unsubstituted nitrogen-containing six-membered heterocyclic group. m is an integer of 1 to 4, preferably 1 to 3, more preferably 1 or 2. n is an integer of 1 to 4. $R_{32}$ is a substituted or unsubstituted alkyl group or an aromatic hydrocarbon group. When $R_{32}$ is a substituted or unsubstituted aromatic hydrocarbon group, $R_{32}$ may be bonded to another $R_{32}$ to form a fused cyclic structure in which benzene rings are fused.

The second host material having the carbazole skeleton represented by the formulae (27) to (28) is preferably compounds represented by formulae (8) to (12A) or (29) to (32).

[Formula 22]

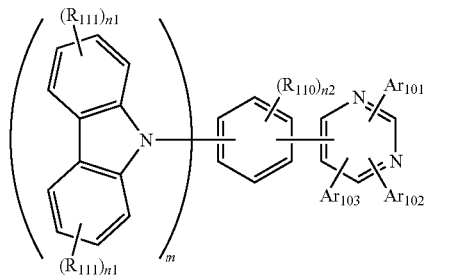
(8)

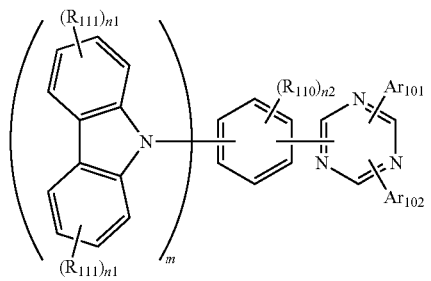
(9)

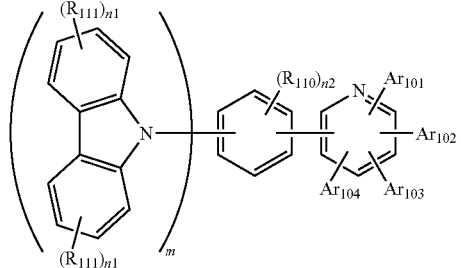
(10)

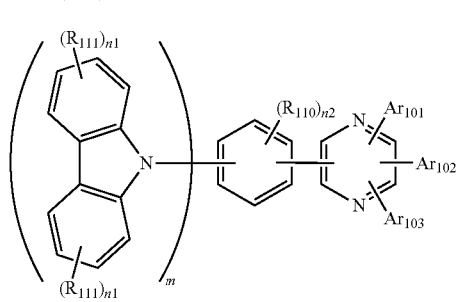
(11)

[Formula 23]

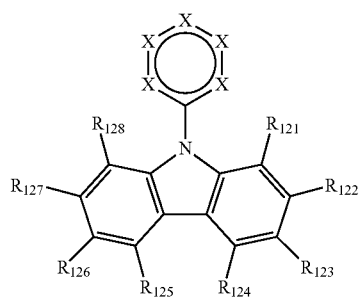
(12)

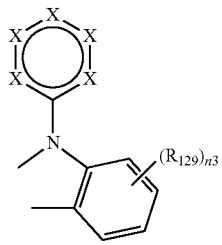
(12A)

In the formulae (8) to (11), $Ar_{101}$ to $Ar_{104}$ are each a hydrogen atom, a substituted or unsubstituted aromatic hydrocarbon group having 6 to 60 ring carbon atoms or a substituted or unsubstituted aromatic heterocyclic group having 5 to 60 ring atoms. All of $Ar_{101}$ to $Ar_{103}$ are not a hydrogen atom at the same time in the formulae (8A), (9A) and (11A), and all of $Ar_{101}$ to $Ar_{103}$ are not a hydrogen atom at the same time in the formula (10A).

$R_{110}$ and $R_{111}$ represent the same as $R_1$.

n1 and n2 are an integer of 1 to 4. m is an integer of 1 to 4. m is preferably an integer of 1 to 3, more preferably 1 or 2. The sum (n2+m) of n2 and m satisfies a relationship of $2 \leq (n2+m) \leq 5$.

In the formulae (12) and (12A), X is a nitrogen atom or CH, in which the number of the nitrogen atom is from 1 to 4.

In the formula (12), $R_{121}$ to $R_{128}$ are each a hydrogen atom, an aromatic hydrocarbon group or an alkyl group, or bonded with a skeleton represented by the formula (12A).

$R_{121}$ to $R_{128}$ bonded with the skeleton represented by the formula (12A) is provided by a structure in which at least one of combinations of $R_{121}$ and $R_{122}$, $R_{122}$ and $R_{123}$, $R_{123}$ and $R_{124}$, $R_{125}$ and $R_{126}$, $R_{126}$ and $R_{127}$, and $R_{127}$ and $R_{128}$ is bonded with the skeleton represented by the formula (12A).

In the formula (12A), $R_{129}$ is a hydrogen atom, an aromatic hydrocarbon group or an alkyl group.

[Formula 24]

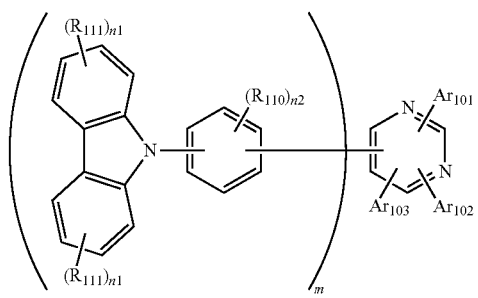
(29)

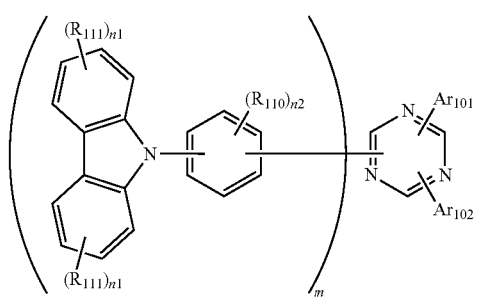
(30)

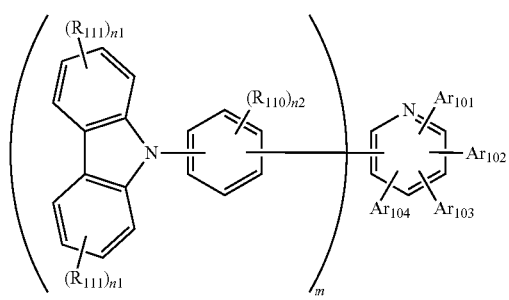
(31)
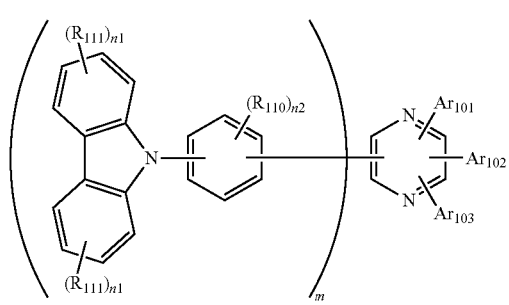
(32)
In the formulae (29) to (32), $Ar_{101}$ to $Ar_{104}$, $R_{110}$, $R_{111}$, n1, n2 and m represent the same as $Ar_{101}$ to $Ar_{104}$, $R_{110}$, $R_{111}$, n1, n2 and m in the formulae (8) to (11).
The second host material represented by the formulae (29) to (32) is preferably compounds below.
[Formula 25]
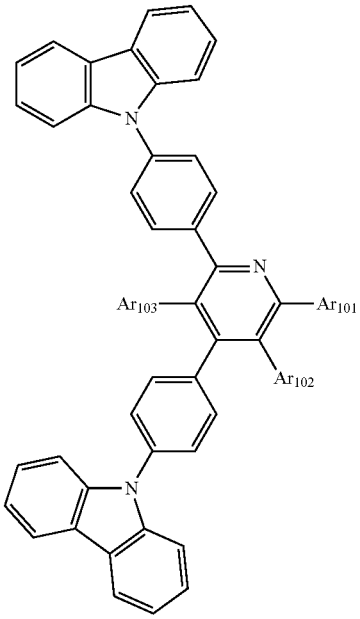
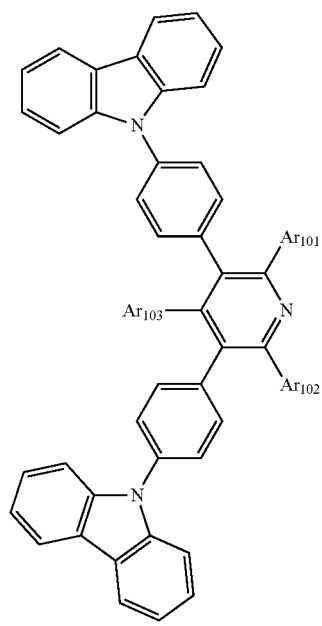
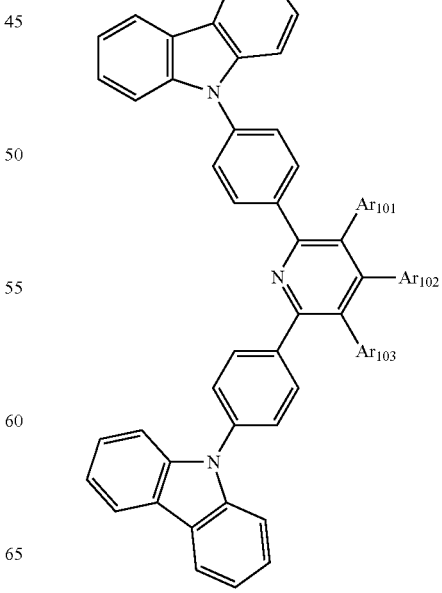

-continued

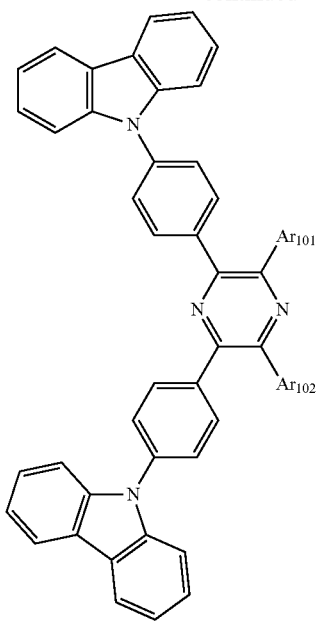

-continued

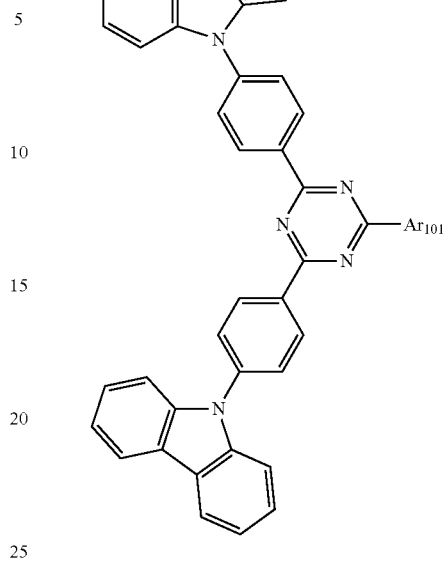

The second host material may be a compound represented by a formula (13) below.

[Formula 26]

(13)

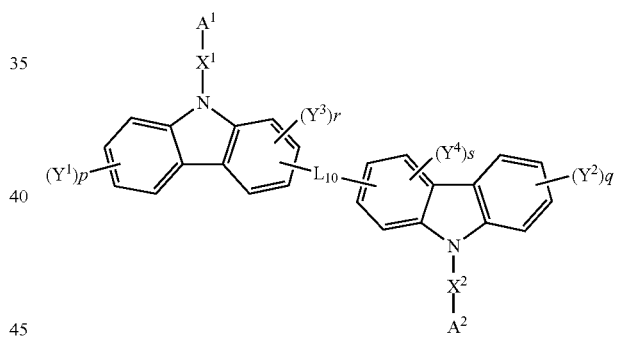

In the formula (13), $A^1$ is a substituted or unsubstituted nitrogen-containing six-membered heterocyclic group.

$A^2$ is a substituted or unsubstituted aromatic hydrocarbon group having 6 to 30 ring carbon atoms or a substituted or unsubstituted nitrogen-containing heterocyclic group having 5 to 30 ring atoms.

$L^{10}$ is a single bond or a linking group.

The linking group is a substituted or unsubstituted aromatic hydrocarbon group having 6 to 30 ring carbon atoms, a substituted or unsubstituted heterocyclic group having 5 to 30 ring atoms, or a group derived from a group formed by mutually bonding two to five of the substituted or unsubstituted aromatic hydrocarbon group having 6 to 30 ring carbon atoms and/or the substituted or unsubstituted heterocyclic group having 5 to 30 ring atoms.

The mutually bonded groups are mutually the same or different.

$X^1$ and $X^2$ are each independently a single bond, a substituted or unsubstituted aromatic hydrocarbon group having 6 to 30 ring carbon atoms, or a substituted or unsubstituted heterocyclic group having 5 to 30 ring atoms.

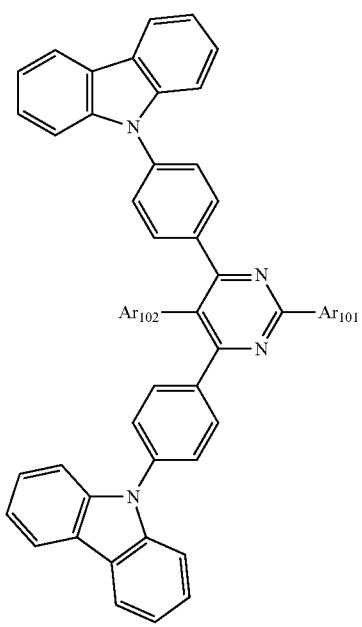

When $X^1$ is a single bond, $A^1$ and N, which are adjacent to $X^1$, are directly bonded to each other. When $X^2$ is a single bond, $A^2$ and N, which are adjacent to $X^2$, are directly bonded to each other.

$Y^1$ to $Y^4$ are each independently a hydrogen atom, a fluorine atom, a cyano group, a substituted or unsubstituted alkyl group having 1 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aromatic hydrocarbon group having 6 to 30 ring carbon atoms, or a substituted or unsubstituted heterocyclic group having 5 to 30 ring atoms. Adjacent ones of $Y^1$ to $Y^4$ may be bonded to each other to form a cyclic structure.

p and q each are an integer of 1 to 4, and r and s each are an integer of 1 to 3.

When p and q each are an integer of 2 to 4 and r and s each are an integer of 2 to 3, a plurality of $Y^1$ to $Y^4$ may be the same or different.

At least one of $A^1$, $A^2$, $X^1$, $X^2$ and $Y^1$ to $Y^4$ is a group derived from a monoazine derivative, a diazine derivative or a triazine derivative.

Preferably, the compound represented by the formula (13) is preferably represented by a formula (13A) below.

[Formula 27]

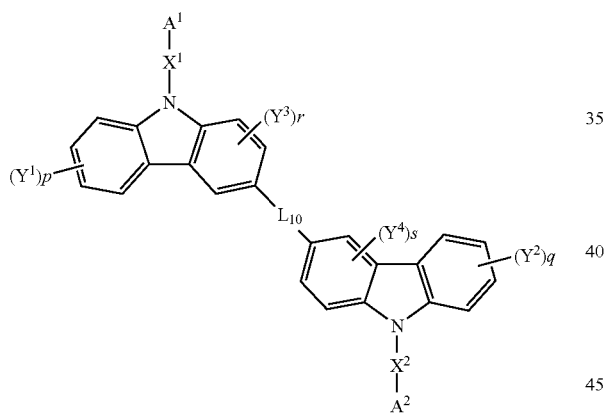

(13A)

In the formula (13A), $A^1$, $A^2$, $L^{10}$, $X^1$, $X^2$, $Y^1$ to $Y^4$, p, q, r and s represent the same as $A^1$, $A^2$, $L^{10}$, $X^1$, $X^2$, $Y^1$ to $Y^4$, p, q, r and s in the formula (13).

Preferably, the compound represented by the formula (13) is preferably represented by a formula (13C) below.

[Formula 28]

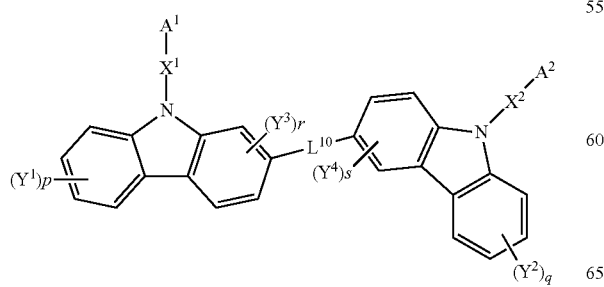

(13C)

In the formula (13C), $A^1$, $A^2$, $L^{10}$, $X^1$, $X^2$, $Y^1$ to $Y^4$, p, q, r and s represent the same as $A^1$, $A^2$, $L^{10}$, $X^1$, $X^2$, $Y^1$ to $Y^4$, p, q, r and s in the formula (13).

Preferably, the compound represented by the formula (13) is preferably represented by a formula (13D) below.

[Formula 29]

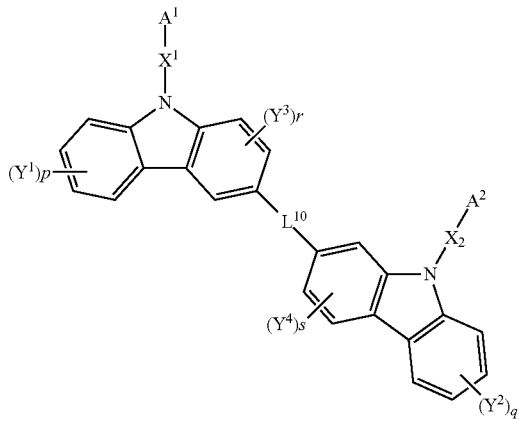

(13D)

In the formula (13D), $A^1$, $A^2$, $X^1$, $X^2$, $Y^1$ to $Y^4$, p, q, r and s are the same as $A^1$, $A^2$, $X^1$, $X^2$, $Y^1$ to $Y^4$, p, q, r and s in the formula (13).

The second host material of the formula (13A) is exemplified by compounds below. The compound of the second host material of the formula (13A) includes exemplified compounds represented by a formula (13B) as the second host material.

[Formula 30]

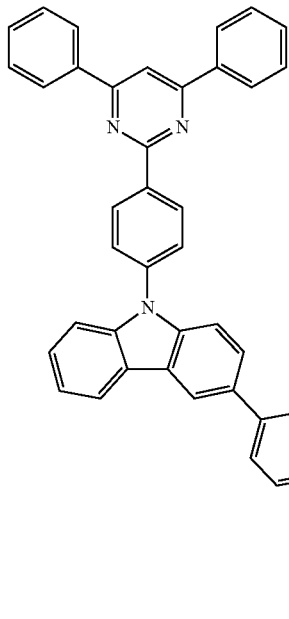

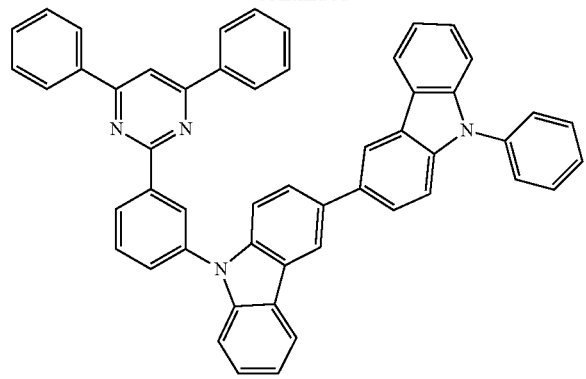
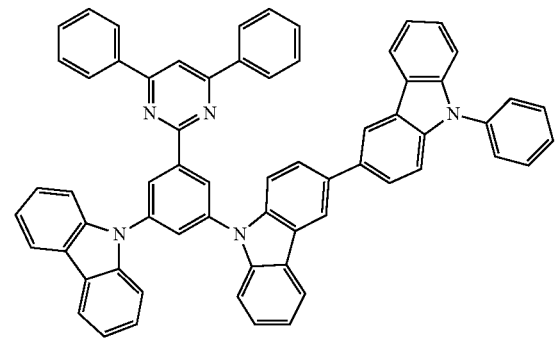
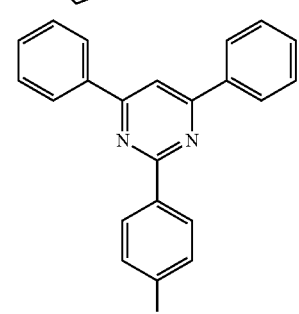
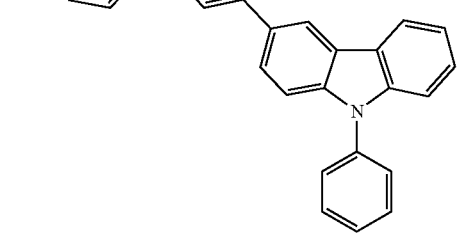
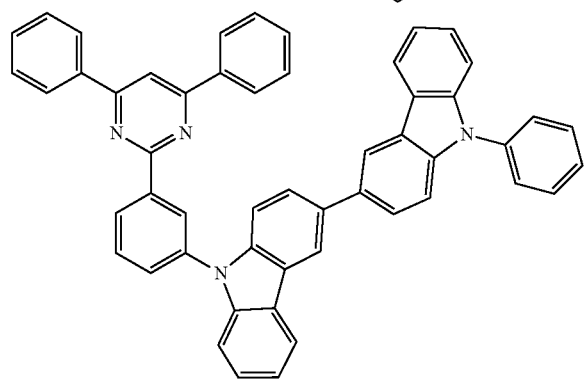
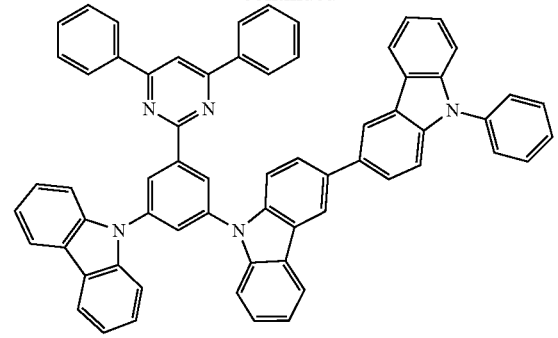
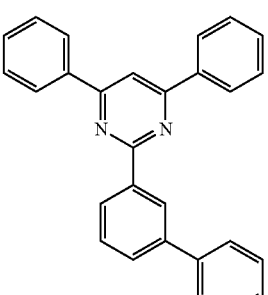
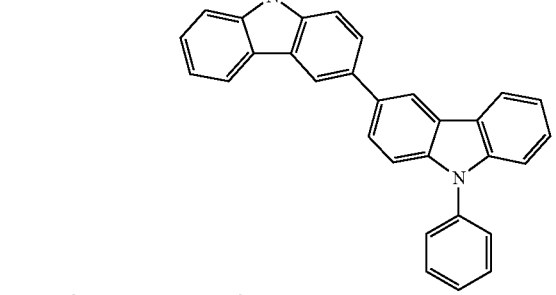
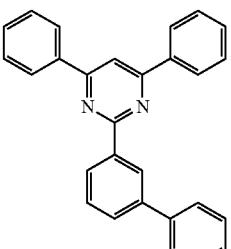
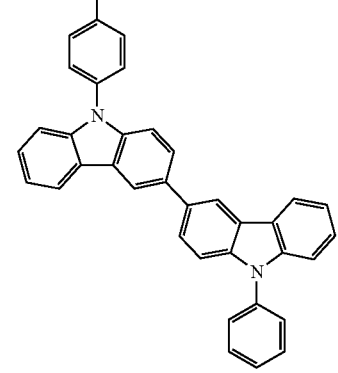

[Formula 31]
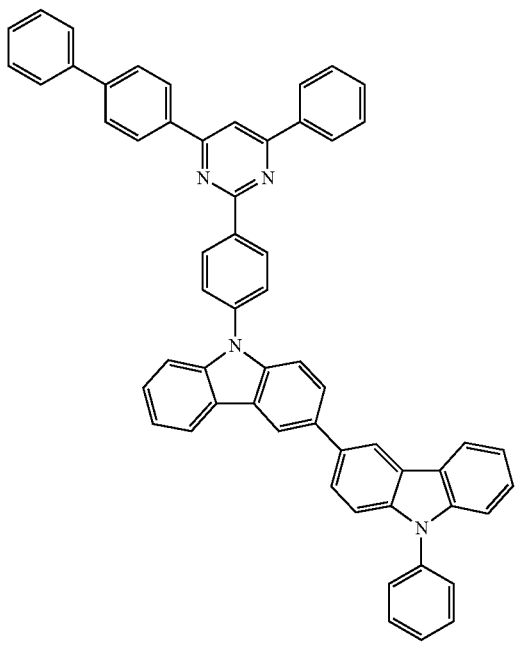
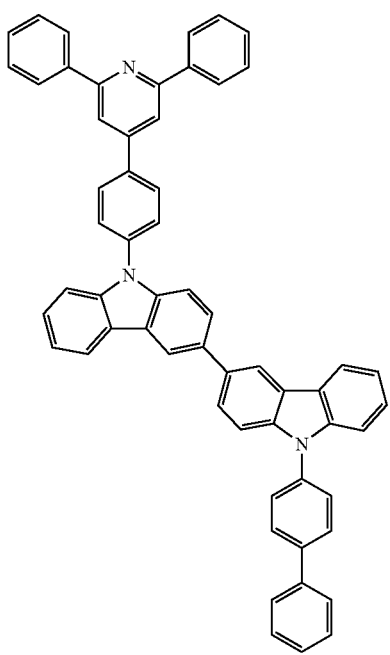
[Formula 32]
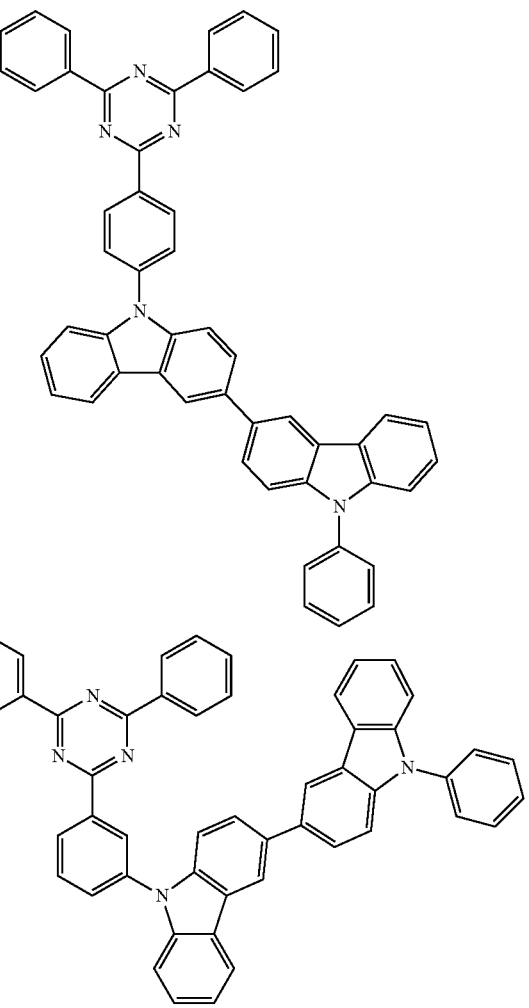
[Formula 33]
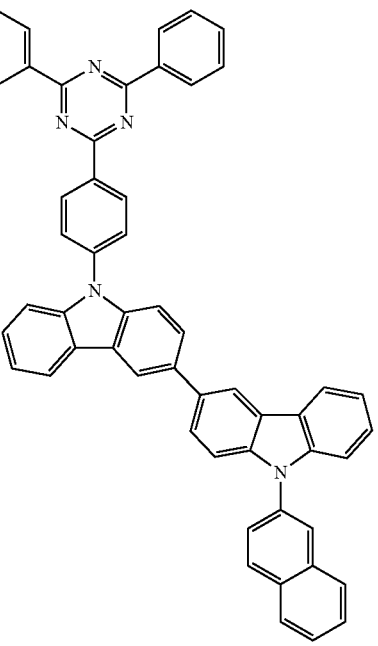

[Formula 34]
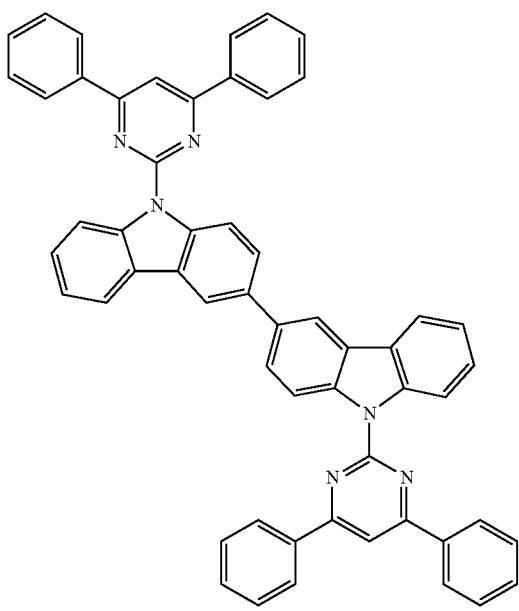
[Formula 35]
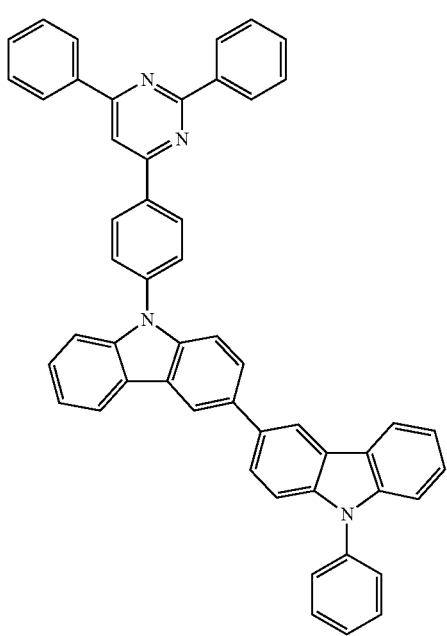
[Formula 36]
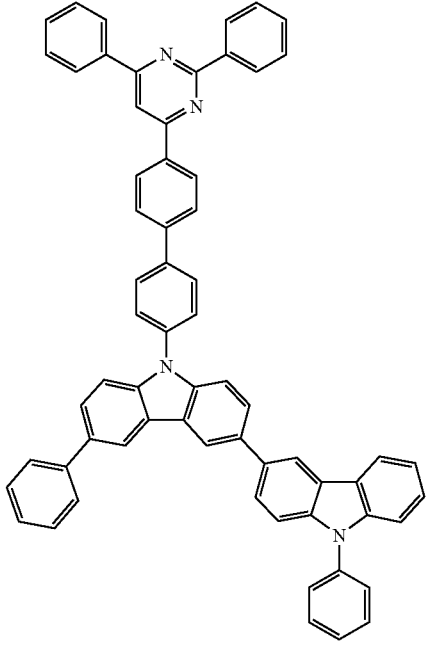
[Formula 37]
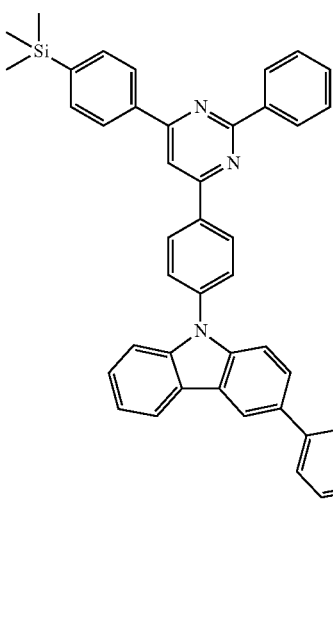

[Formula 38]
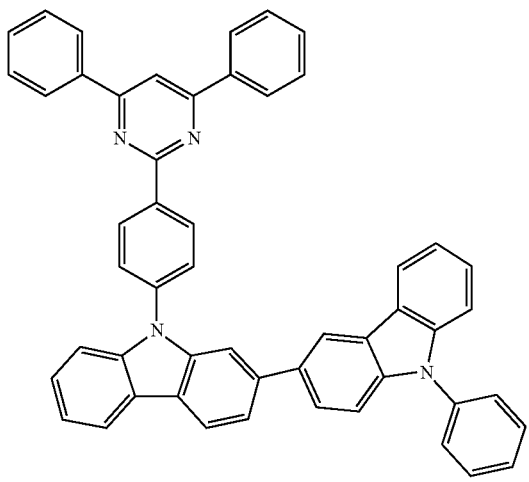
[Formula 39]
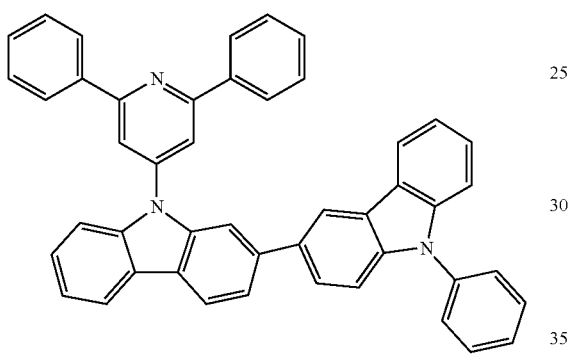
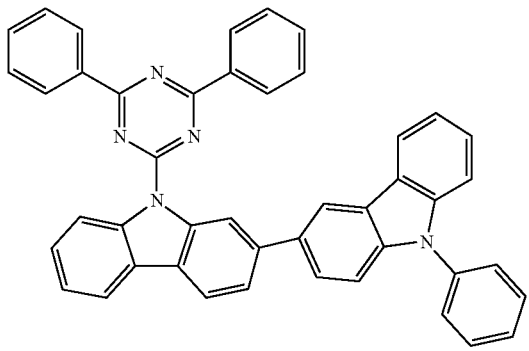
[Formula 40]
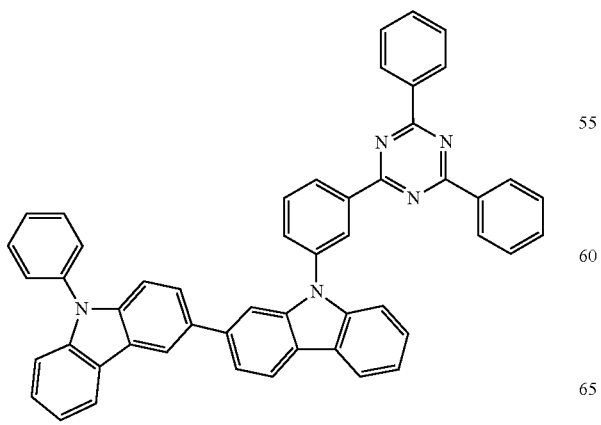
[Formula 41]
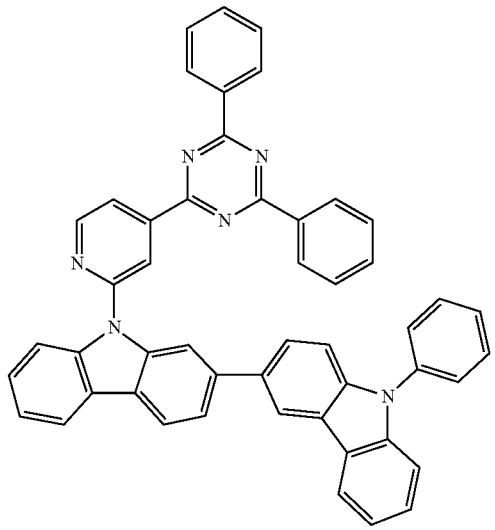
[Formula 42]
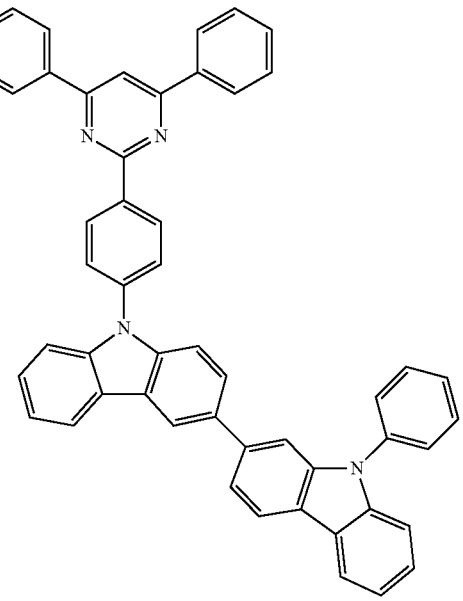

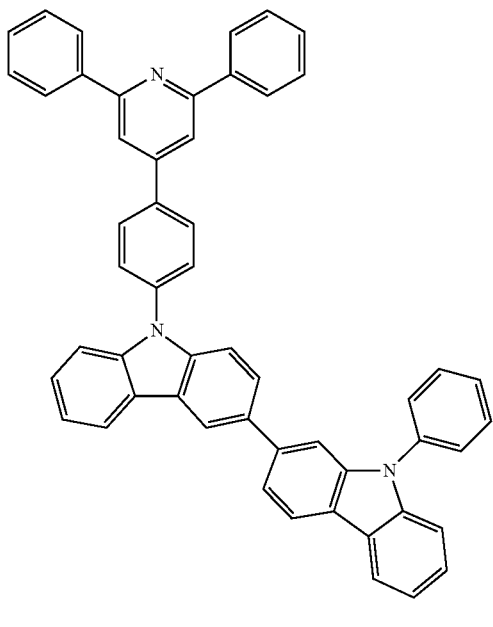
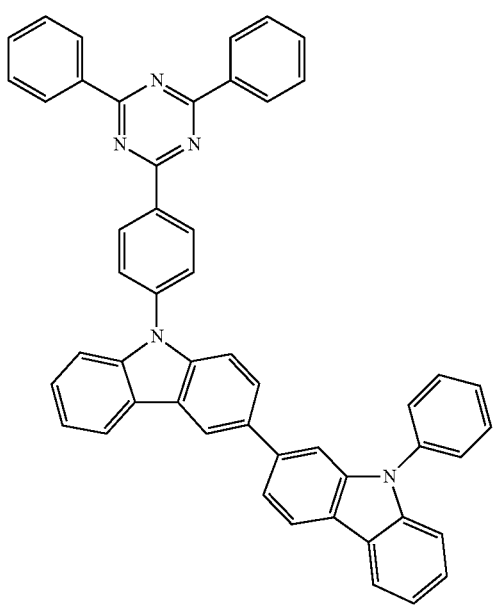
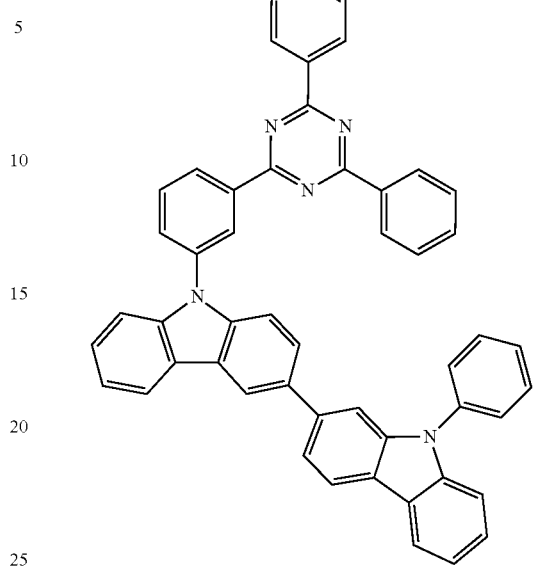
The second host material may be a compound represented by a formula (14) or (15).
[Formula 44]
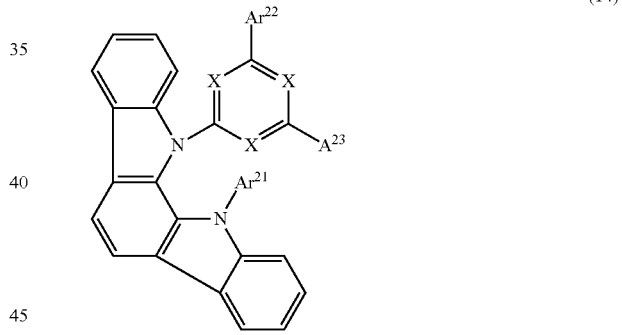
(14)
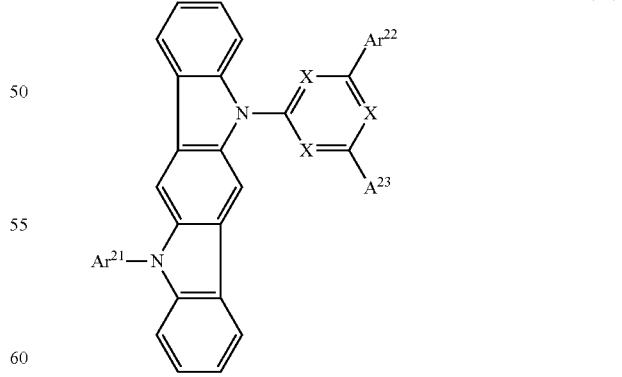
(15)
In the formulae (14) and (15), X is CH or an N atom, in which at least one of X is the N atom. $Ar^{21}$ to $Ar^{23}$ are each independently a substituted or unsubstituted aromatic hydrocarbon group or heterocyclic ring, both of which having no fused cyclic structure.

Ar²² or Ar²³ may form a fused ring with a ring including X.

Particularly preferable examples of the compound as the second host material are compounds below.

[Formula 45]

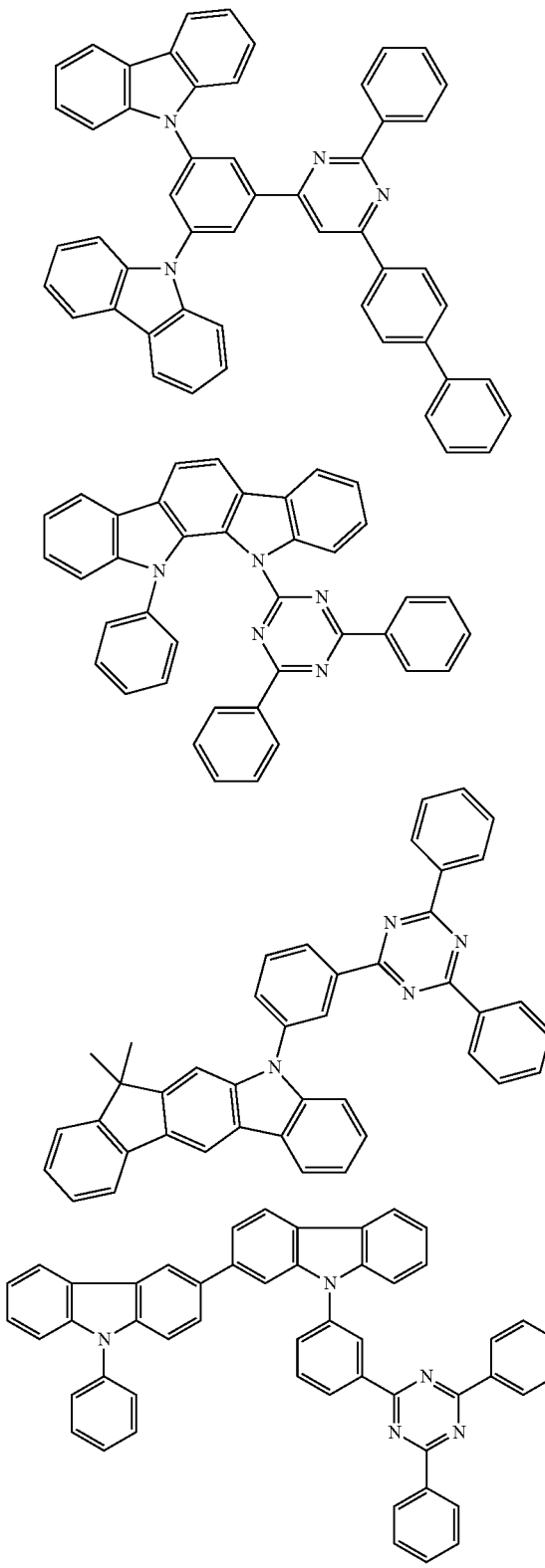

Third Host Material

The third host material in the exemplary embodiment is only required to satisfy the above-described relationship with the second host material, in other words, to satisfy the formula (N-1) and at least one of the formulae (N-2) and (N-3). For instance, the third host material is exemplified by the examples of the material for the first host material and the examples of the material for the second host material which satisfy the above-described relationship with the second host material. The third host material is preferably a compound having a five-membered cyclic structure in a molecule. Moreover, the third host material is also preferably a compound having a skeleton represented by a formula (130) below.

[Formula 46]

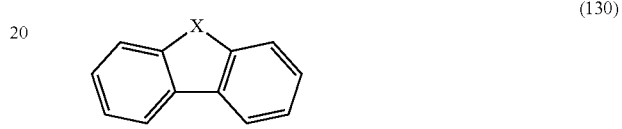

(130)

In the formula (130), X represents an oxygen atom, a sulfur atom, $NR^{130}$ or $CR^{131}R^{132}$.

$R^{130}$ to $R^{132}$ are each independently a substituted or unsubstituted aromatic hydrocarbon group having 6 to 30 ring carbon atoms, or a substituted or unsubstituted heterocyclic group having 5 to 30 ring atoms. $R^{131}$ and $R^{132}$ may be partially bonded to each other to form a cyclic structure.

The third host material is preferably a compound having the skeleton represented by the formula (130), more preferably a compound having a carbazolyl group. The third host material is particularly preferably a biscarbazole derivative in which two carbazolyl groups are directly bonded. The biscarbazole derivative suitable as the third host material is represented by a formula (16) below.

[Formula 47]

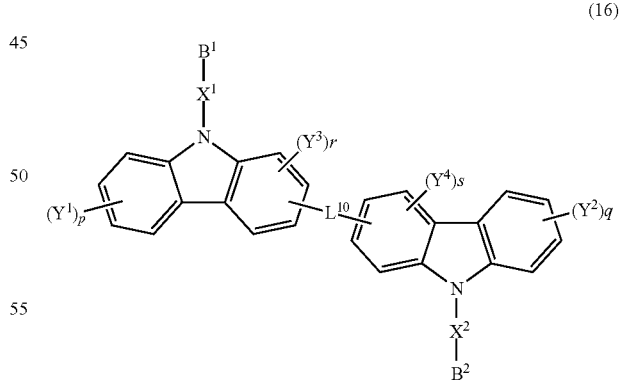

(16)

In the formula (16), $L^{10}$, $X^1$, $X^2$, $Y^1$ to $Y^4$, p, q, r and s represent the same as $L^{10}$, $X^1$, $X^2$, $Y^1$ to $Y^4$, p, q, r and s in the formula (13). $B^1$ and $B^2$ are each a substituted or unsubstituted aromatic hydrocarbon group having 6 to 30 ring carbon atoms or a substituted or unsubstituted heterocyclic group having 5 to 30 ring atoms.

Preferable examples of the compound as the third host material are compounds below.

[Formula 48]

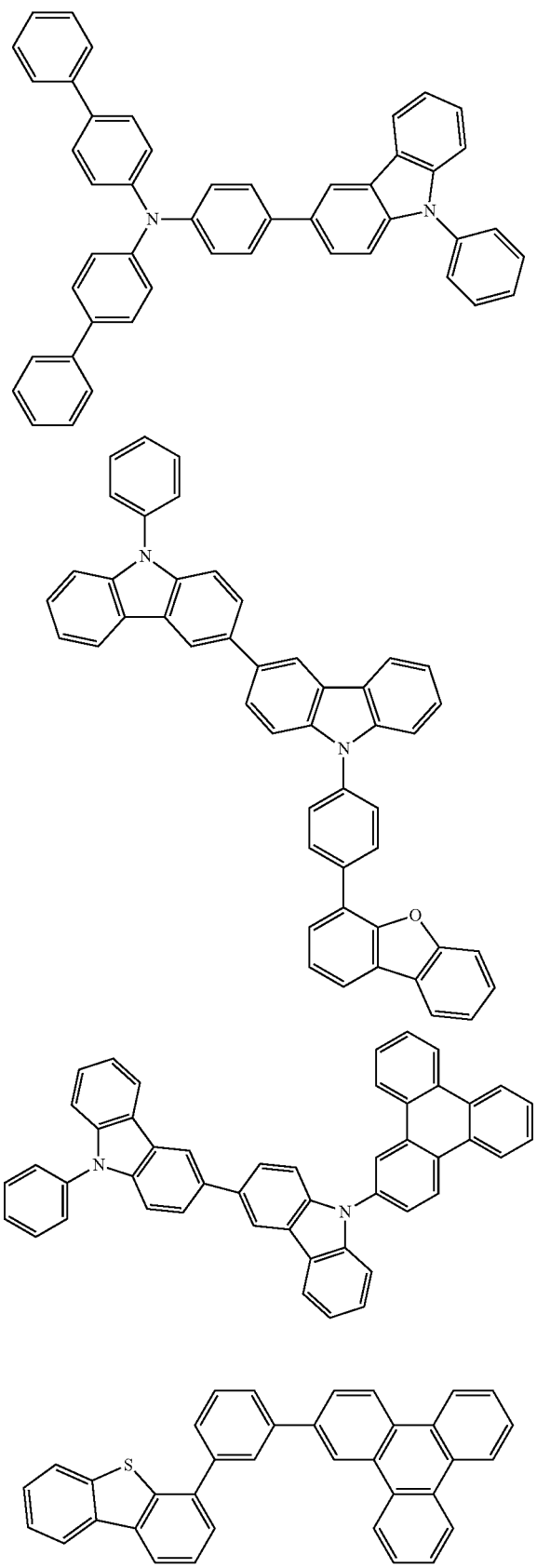
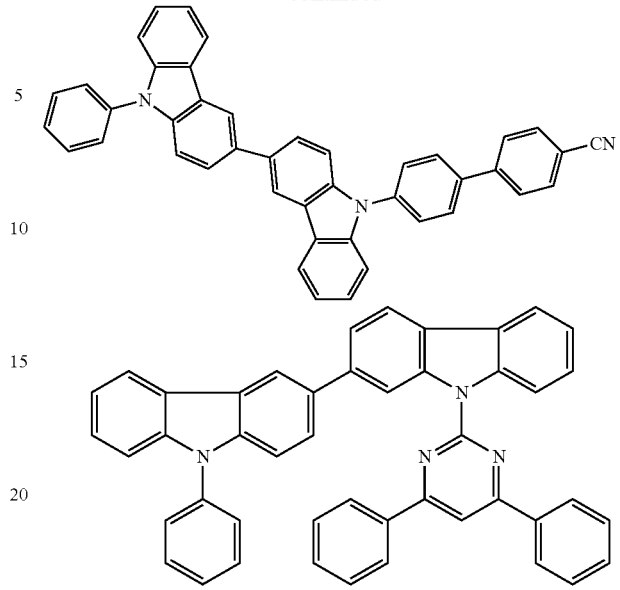

In the second emitting layer of the exemplary embodiment, a ratio (mass ratio) between the second host material and the third host material is preferably in a range of 99:1 to 1:99, more preferably in a range of 90:10 to 10:90, further preferably in a range of 80:20 to 20:80. A ratio of the second and third host materials (i.e., the sum of the host material in the second emitting layer) and the second dopant material is preferably in a range of 99:1 to 50:50 at a mass ratio.

Second Dopant Material

The second dopant material of the exemplary embodiment is preferably a phosphorescent metal complex. The same as described above as the first host material is usable as the second dopant material in the exemplary embodiment. Specifically, the above compounds (K-1) to (K-10), (K-12) to (K-14), (K-23) to (K-26) and Ir(Ph-ppy)$_3$ are preferable.

The second dopant material preferably exhibits a luminescence peak of less than 570 nm, more preferably of 565 nm or less. A luminescent color showing the luminescence peak of less than 570 nm is, for instance, green.

Substrate

The organic EL device 1 is formed on the light-transmissive substrate 2. The light-transmissive substrate 2 supports the anode, the organic compound layer, the cathode and the like of the organic EL device. The light-transmissive substrate 2 is preferably a smooth and flat substrate that transmits 50% or more of light in a visible region of 400 nm to 700 nm.

The light-transmissive plate is exemplified by a glass plate and a polymer plate.

The glass plate is formed of soda-lime glass, barium/strontium-containing glass, lead glass, aluminosilicate glass, borosilicate glass, barium borosilicate glass, quartz and the like.

The polymer plate is formed of polycarbonate, acryl, polyethylene terephthalate, polyether sulfide and polysulfone.

Anode and Cathode

The anode of the organic EL device injects holes into the emitting layer, so that it is efficient that the anode has a work function of 4.5 eV or more.

Exemplary materials for the anode are indium-tin oxide (ITO), tin oxide (NESA), indium zinc oxide, gold, silver, platinum and copper.

When light from the emitting layer is to be emitted through the anode, the anode preferably transmits more than 10% of the light in the visible region. Sheet resistance of the anode is preferably several hundreds Q/sq. or lower. The thickness of the anode is typically in the range of 10 nm to 1 µm, and preferably in the range of 10 nm to 200 nm, though it depends on the material of the anode.

The cathode is preferably formed of a material with smaller work function in order to inject electrons into the emitting layer.

Although a material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, and alloy of magnesium and silver.

Like the anode, the cathode may be made by forming a thin film on, for instance, the electron transporting layer and the electron injecting layer by a method such as vapor deposition. In addition, the light from the emitting layer may be emitted through the cathode. When light from the emitting layer is to be emitted through the cathode, the cathode preferably transmits more than 10% of the light in the visible region.

Sheet resistance of the cathode is preferably several hundreds Ω/sq. or lower. The thickness of the cathode is typically in the range of 10 nm to 1 µm, and preferably in the range of 50 nm to 200 nm, though it depends on the material of the cathode.

Hole Injecting•Transporting Layer

The hole injection/transport layer helps injection of holes to the emitting layer and transport the holes to an emitting region. A compound having a large hole mobility and a small ionization energy is used as the hole injection/transport layer.

A material for forming the hole injection/transport layer is preferably a material of transporting the holes to the emitting layer at a lower electric field intensity. For instance, an aromatic amine compound is preferably used.

Electron Injecting•Transporting Layer

The electron injecting•transporting layer helps injection of the electrons into the emitting layer and transports the electrons to an emitting region. A compound having a large electron mobility is used as the electron injecting•transporting layer.

A preferable example of the compound used as the electron injecting•transporting layer is an aromatic heterocyclic compound having at least one heteroatom in a molecule. Particularly, a nitrogen-containing cyclic derivative is preferable. The nitrogen-containing cyclic derivative is preferably a heterocyclic compound having a nitrogen-containing six-membered or five-membered ring skeleton.

In the organic EL device in the exemplary embodiment, in addition to the above exemplary compound, any compound selected from compounds to be used in the typical organic El device is usable as a compound for the organic compound layer other than the first emitting layer 51 and the second emitting layer 52.

Layer Formation Method(s)

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Manufacturing Method of Organic EL Device

In manufacturing the organic EL device in the exemplary embodiment (i.e., the organic EL device of which chromaticity is easily adjustable), firstly, the first emitting layer and the second emitting layer are provided between the anode and the cathode as described above. On the first emitting layer, films are respectively formed of the first host material and the first dopant material. On the second emitting layer, films are respectively formed of the second host material, the third host material satisfying the formula (N-1) and at least one of the formulae (N-2) and (N-3), and the second dopant material. At this time, the concentration of the third host material relative to the total mass of the second host material and the third host material in the second emitting layer is determinable depending on a desired chromaticity of the organic EL device.

Second Exemplary Embodiment

Next, an organic EL device according to a second exemplary embodiment will be described below.

Figure 2:
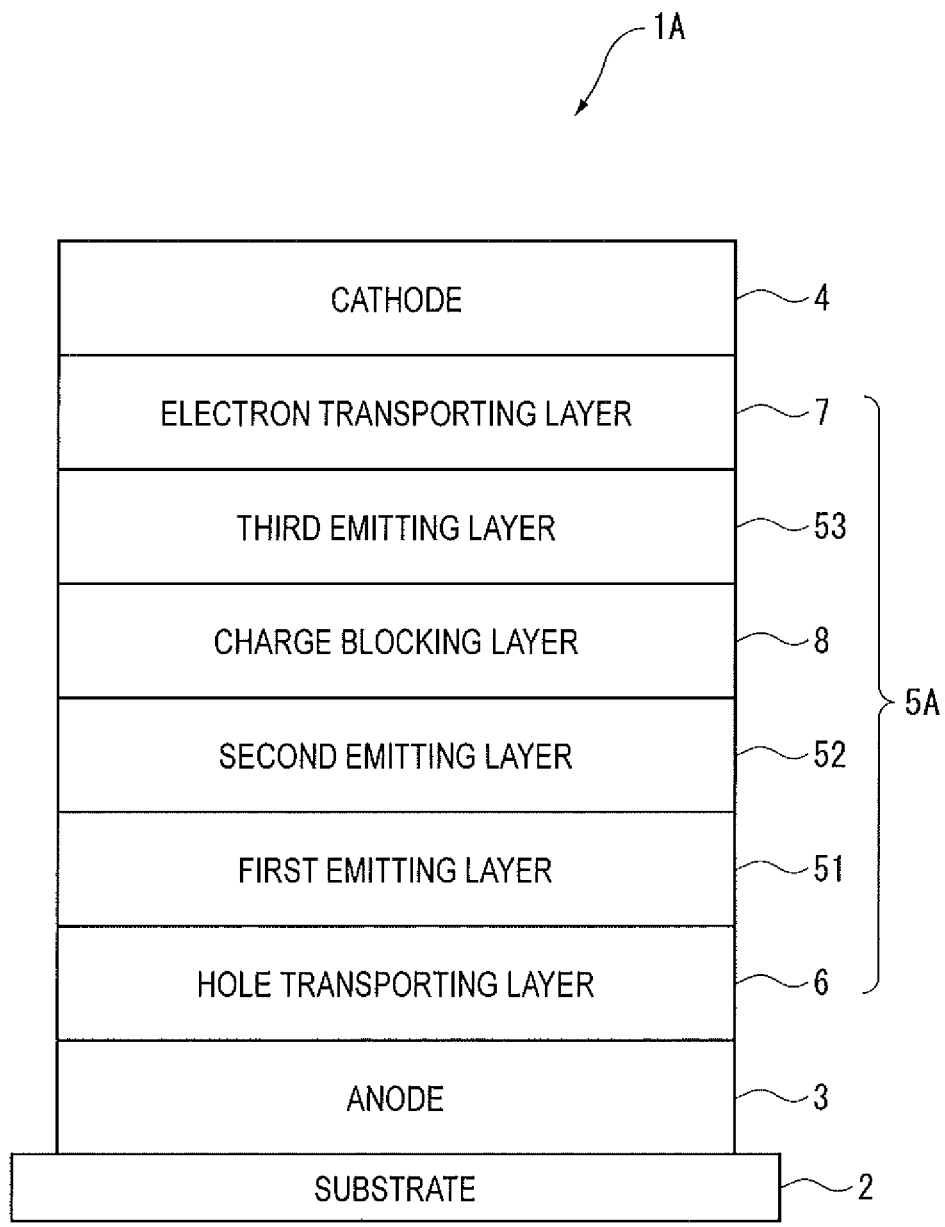
FIG. 2 schematically shows an exemplary arrangement of an organic EL device according to a second exemplary embodiment of the invention.

As shown in FIG. 2, an organic EL device 1A according to the second exemplary embodiment is different from the organic EL device in the first exemplary embodiment in that the organic EL device 1A further includes a charge blocking layer 8 and a third emitting layer 53 between the second emitting layer 52 and the electron transporting layer 7 in an emitting unit 5A.

The charge blocking layer 8 is continuously formed on the second emitting layer 52 near the cathode 4. The third emitting layer 53 is continuously formed between the charge blocking layer 8 and the electron transporting layer 7.

Provided as an energy barrier of an HOMO level or an LUMO level between the second emitting layer 52 and the third emitting layer 53 adjacent thereto, the charge blocking layer 8 controls injection of charge (holes or electrons) into the second emitting layer 52 and the third emitting layer 53 and controls balance of charge injected thereinto.

The third emitting layer 53 is, for instance, a blue fluorescent emitting layer having a peak wavelength of 450 to 500 nm. The third emitting layer 53 contains a fourth host material and a fourth dopant material.

The fourth host material is exemplified by a compound having a central anthracene skeleton represented by a formula (41) below.

[Formula 49]

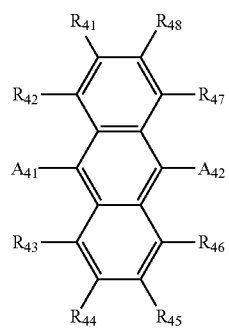

(41)

In the formula (41), $Ar_{41}$ and $Ar_{42}$ are each a group derived from a substituted or unsubstituted aromatic ring having 6 to 20 ring carbon atoms.

$R_{41}$ to $R_{48}$ are each independently a hydrogen atom, a substituted or unsubstituted aromatic hydrocarbon group having 6 to 50 ring carbon atoms, a substituted or unsubstituted hetero aromatic hydrocarbon group having 5 to 50 ring atoms, a substituted or unsubstituted alkyl group having 1 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxyl group, a halogen group, a cyano group, a nitro group or a hydroxyl group.

The substituent(s) to be linked to the aromatic ring of $A_{41}$ and $A_{42}$ is a substituted or unsubstituted aromatic hydrocarbon group having 6 to 50 ring carbon atoms, substituted or unsubstituted alkyl group having 1 to 50 carbon atoms, substituted or unsubstituted cycloalkyl group having 3 to 50 carbon atoms, substituted or unsubstituted alkoxy group having 1 to 50 carbon atoms, substituted or unsubstituted aralkyl group having 6 to 50 carbon atoms, substituted or unsubstituted aryloxy group having 5 to 50 ring atoms, substituted or unsubstituted arylthio group having 5 to 50 ring atoms, substituted or unsubstituted alkoxycarbonyl group having 1 to 50 carbon atoms, substituted or unsubstituted silyl group, carboxyl group, halogen atom, cyano group, nitro group or hydroxyl group.

Examples of the fourth dopant material are an arylamine compound, a styrylamine compound, anthracene, naphthalene, phenanthrene, pyrene, tetracene, coronene, chrysene, fluorescein, perylene, phthaloperylene, naphthaloperylene, perynone, phthaloperynone, naphthaloperynone, diphenylbutadiene, tetraphenylbutadiene, coumaline, oxadiazole, aldazine, bisbenzoxazoline, bisstyryl, pyrazine, cyclopentadiene, a metal complex of quinoline, a metal complex of aminoquinoline, a metal complex of benzoquinoline, imine, diphenylethylene, vinylanthracene, diaminocarbazole, pyrane, thiopyrane, polymethine, merocyanin, an imidazole chelated oxinoid compound, quinacridone, rubrene and a fluorescent dye.

In the organic EL device 1A, for instance, the first dopant material exhibiting a red emission is used in the first emitting layer 51 and the second dopant material exhibiting a green emission is used in the second emitting layer 52. In this arrangement, since the third emitting layer 53 exhibiting a blue emission is provided in addition to the emitting layers 51 and 52, the organic EL device can exhibit a white emission as a whole of the device.

Accordingly, the organic EL device 1A is suitably applicable as a surface light source for lighting, a backlight and the like.

Third Exemplary Embodiment

An organic EL device according to this exemplary embodiment may have a tandem device structure in which at least two emitting units are provided. In such a tandem device structure, an intermediate layer is interposed between the two emitting units.

The intermediate layer, which is a layer as a supply source for injecting electrons or holes into the emitting units, is provided by an intermediate electroconductive layer or a charge generating layer. In addition to charges injected from a pair of electrodes, charges supplied from the intermediate layer are injected into the emitting unit. Accordingly, by providing the intermediate layer, luminous efficiency (current efficiency) relative to injected current is improved.

In the exemplary embodiment, at least one of the at least two emitting units at least includes the hole transporting layer, the first and second emitting layers in this exemplary embodiment, and the electron transporting layer. Among the at least two emitting units, an emitting unit(s) other than the emitting unit including the first and second emitting layers of this exemplary embodiment may be subject to no limitation as long as the emitting unit(s) includes at least one emitting layer.

Specific examples of the organic EL device of this exemplary embodiment are shown below.

(14) anode/first emitting unit/intermediate layer/second emitting unit/cathode

Figure 3:
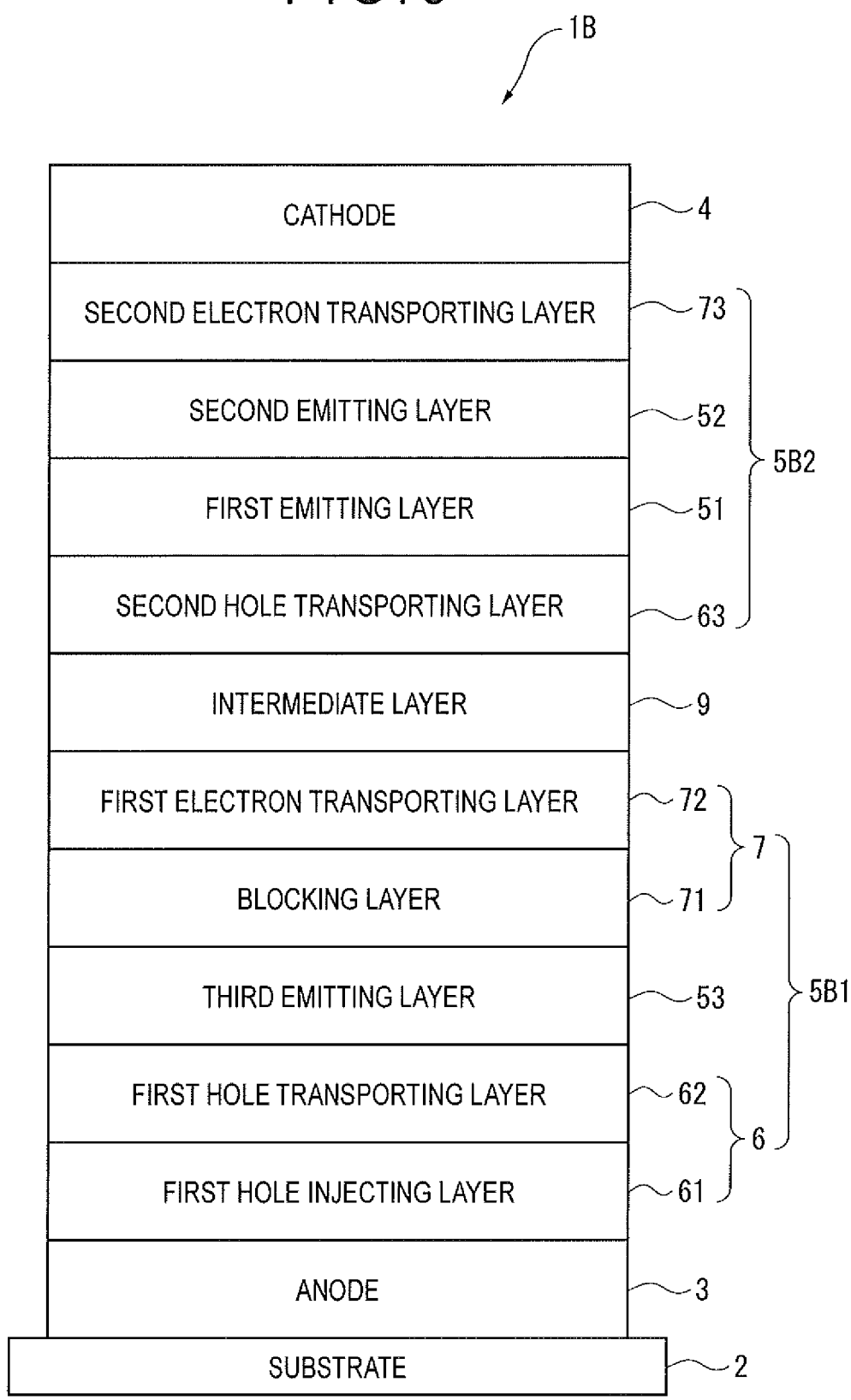
FIG. 3 schematically shows an exemplary arrangement of an organic EL device according to a third exemplary embodiment of the invention.

(15) anode/first emitting unit/intermediate layer/second emitting unit/intermediate layer/third emitting unit/cathode FIG. 3 shows one example of the organic EL device according to the third exemplary embodiment.

An organic EL device 1B includes the anode 3, a first emitting unit 5B1, the intermediate layer 9, a second emitting unit 5B2 and the cathode 4 in this order.

The first emitting unit 5B1 includes a hole transporting zone 6, the third emitting layer 53, and an electron transporting zone 7 from the anode 3 in this order.

The hole transporting zone 6 includes a first hole injecting layer 61 and a first hole transporting layer 62.

The third emitting layer 53 includes a host material and a dopant material exhibiting fluorescent emission of a main peak wavelength of 550 nm or less.

The electron transporting zone 7 includes a blocking layer 71 adjacent to the third emitting layer 53 and a first electron transporting layer 72.

The second emitting unit 5B2 is structured in the same manner as the emitting unit of the first exemplary embodiment. The second emitting unit 5B2 includes a second hole transporting layer 63, the first emitting layer 51, the second emitting layer 52 and a second electron transporting layer 73 from the anode 3 in this order.

Triplet energy (ETd) of the dopant material of the third emitting layer 53 is preferably larger than triplet energy (ETh) of the host material. Triplet energy (ETb) of the blocking layer 71 is preferably larger than ETh. Accordingly, triplet excitons are trapped in the third emitting layer 53 to effectively cause a TTF phenomenon (a phenomenon where singlet excitons are generated by collision and fusion of two triplet excitons), thereby providing a fluorescent device with high efficiency.

Herein, the blocking layer 71 means a layer functioning as a barrier against the triplet energy. Accordingly, the blocking layer functions differently from a hole blocking layer and a charge blocking layer.

A commercially-available measuring machine F-4500 (manufactured by Hitachi, Ltd.) was used for measuring triplet energy. The conversion equation of triplet energy $E^T$ is as follows.

The conversion equation: $E^T(\text{eV}) = 1239.85/\lambda_{edge}$

When the phosphorescence spectrum is expressed in coordinates of which the ordinate axis indicates the phosphorescence intensity and of which the abscissa axis indicates the wavelength, and a tangent is drawn to the rise of the phosphorescence spectrum on the shorter wavelength side, "$\lambda_{edge}$" is a wavelength value (unit: nm) at the intersection of the tangent and the abscissa axis.

Examples of the intermediate layer 9 include a metal, metal oxide, mixture of metal oxides, composite oxide, and electron-accepting organic compound. Examples of the metal are preferably Mg, Al, and a film formed by co-evaporating Mg and Al. Examples of the metal oxide include ZnO, WO₃, MoO₃ and MoO₂. Examples of the mixture of the metal oxides include ITO, IZO, and ZnO:Al. Examples of the electron-accepting organic compound include an organic compound having a CN group as a substituent. Preferable examples of the organic compound having a CN group include a triphenylene derivative, tetracyanoquinodimethane derivative and indenofluorene derivative. The triphenylene derivative is preferably hexacyanohexaazatriphenylene (HAT). The tetracyanoquinodimethane derivative is preferably tetrafluoroquinodimethane and dicyanoquinodimethane. The indenofluorene derivative is preferably a compound disclosed in International Publication No.WO2009/011327, WO2009/069717, or WO2010/064655. The electron accepting substance may be a single substance, or a mixture with other organic compounds.

Examples of the compounds usable for the electron transporting zone, host material, dopant material and blocking layer in the tandem device structure of this exemplary embodiment are compounds disclosed in Patent Application Number PCT/JP2010/003431. The compounds usable for the hole transporting zone are the same as those for the material of the hole transporting layer of the first exemplary embodiment.

When the intermediate layer 9 is a charge generating layer, the electron transporting zone 7 near an interface with the charge generating layer is preferably doped with a donor (e.g., an alkali metal) in order that the third emitting layer 53 can easily accept electrons from the charge generating layer. As the donor, at least one of a donor metal, donor metal compound and donor metal complex can be used. Examples of the compounds usable for the donor metal, donor metal compound and donor metal complex are compounds disclosed in Patent Application Number PCT/JP2010/003434.
Modification(s) of Embodiment(s)

It should be noted that the invention is not limited to the above description but may include any modification as long as such modification stays within a scope and a spirit of the invention.

In the first and second exemplary embodiments, the anode and the hole transporting layer are continuously formed. However, the hole injecting layer may be further provided between the anode and the hole transporting layer.

Preferable examples of a material of the hole injecting layer are a porphyrin compound, an aromatic tertiary amine compound, or a styrylamine compound. Particularly preferable examples include an aromatic tertiary amine compound such as hexacyanohexaazatriphenylene (HAT). With use of hexacyanohexaazatriphenylene, adherence between the anode and the hole transporting layer is improved to increase durability.

Further, the hole transporting performance can be enhanced in a structure where the hole injecting layer and the hole transporting layer are provided between the anode and the first emitting layer, as compared with a structure where holes are directly transported from the anode to the first emitting layer.

In other words, provision of the hole injecting layer and the hole transporting layer can reduce an energy difference in ionization potential between the anode and the hole injecting layer, an energy difference in ionization potential between the hole injecting layer and the hole transporting layer, and an energy difference in ionization potential between the hole transporting layer and the first emitting layer. Accordingly, since energy barrier can be reduced when holes are transferred to each layer, hole transporting performance can be improved and consequently luminous efficiency and the like can be improved.

In the first to third exemplary embodiments, the cathode and the electron transporting layer are continuously formed to each other. However, the electron injecting layer may be further formed between the cathode and the electron transporting layer.

Although two emitting units are formed in the third exemplary embodiments, three or more emitting units may be formed. In this arrangement, a charge generating layer may be provided each between the emitting units.

Figure 4:
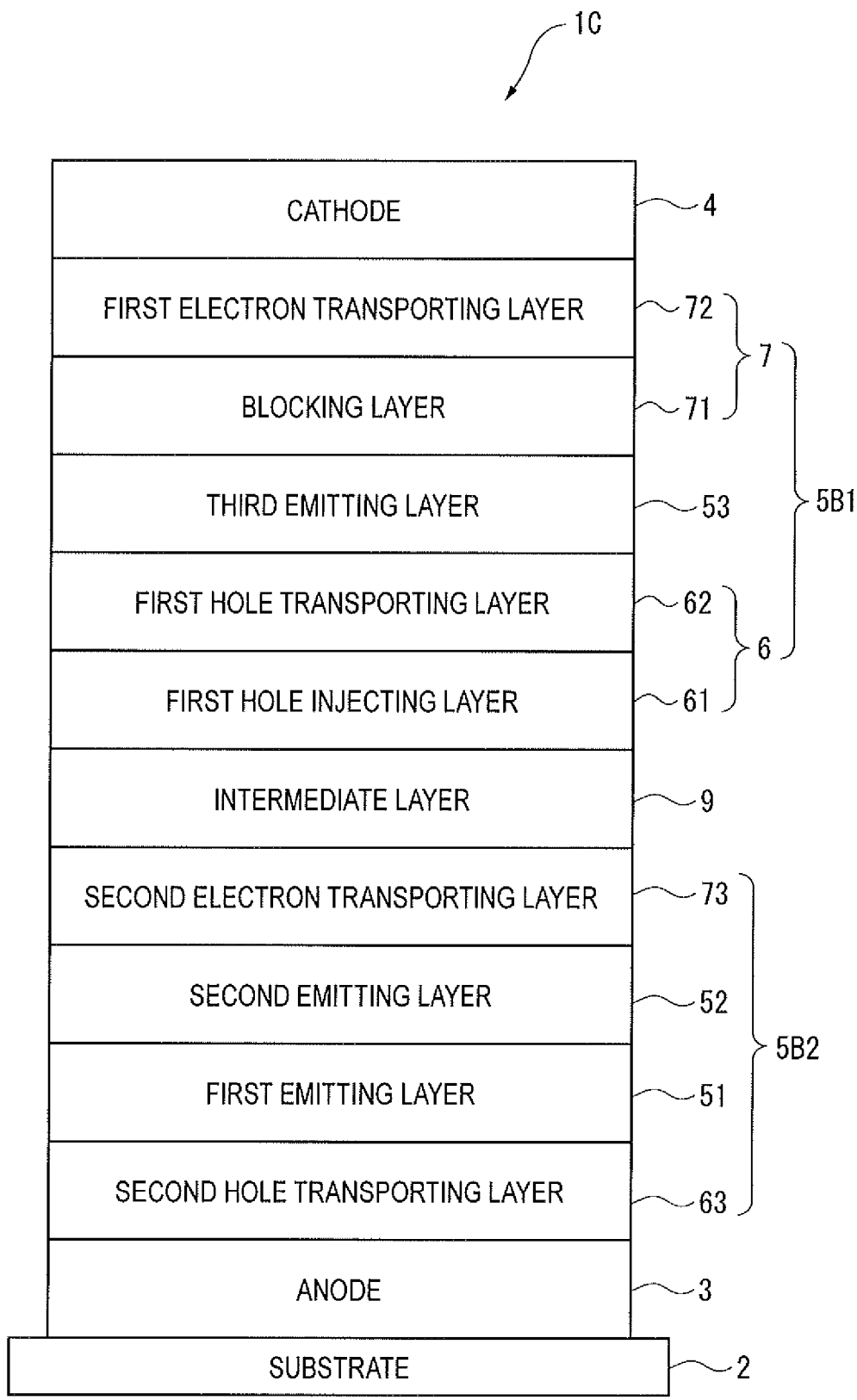
FIG. 4 schematically shows an organic electroluminescence device according to a modification example of the invention.

Alternatively, the organic EL device 1B in the third exemplary embodiment may be an organic EL device 1C shown in FIG. 4. The organic EL device 1C includes the anode 3, the second emitting unit 5B2, the intermediate layer 9, the first emitting unit 5B1, and the cathode 4 in this order. In other words, the organic EL device 1C is different from the organic EL device 1B in that the second emitting unit 5B2 is near the anode 3 and the first emitting unit 5B1 near the cathode 4.

The organic EL device in the first to third exemplary embodiments may be used as a display device in addition to a surface light source for an illumination unit, a backlight and the like.

Further, the materials and treatments for practicing the invention may be altered to other arrangements and treatments as long as such other arrangements and treatments are compatible with the invention.

EXAMPLE(S)

Examples of the invention will be described below. However, the invention is not limited by these Examples.

The used compounds were as follows:

[Formula 50]

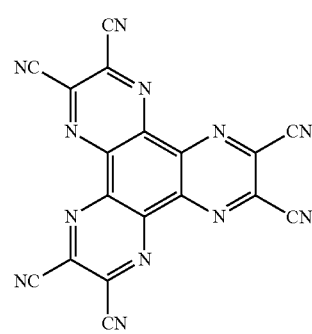

HI

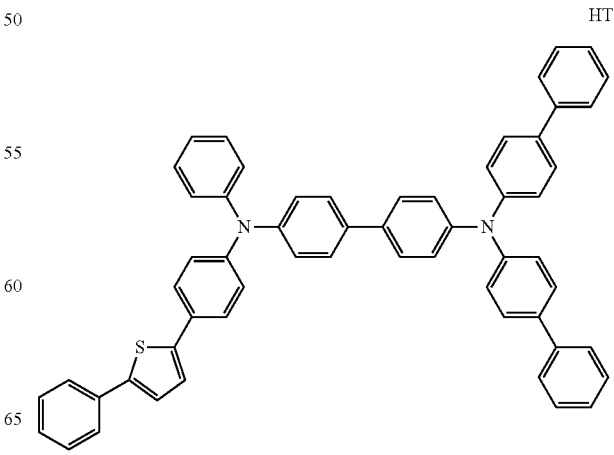

HT

-continued

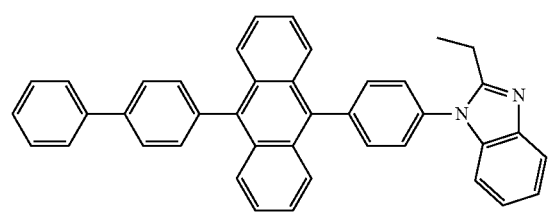
ET

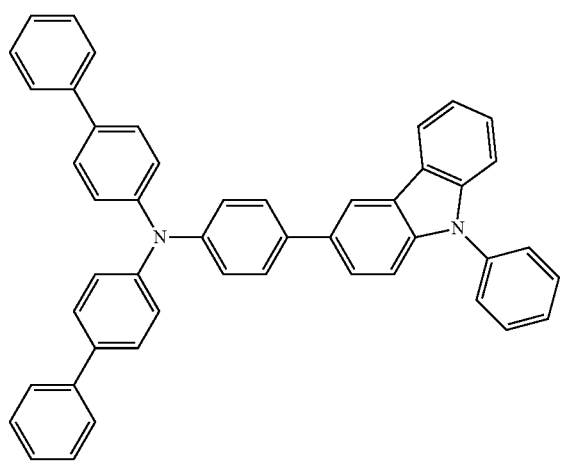
H1

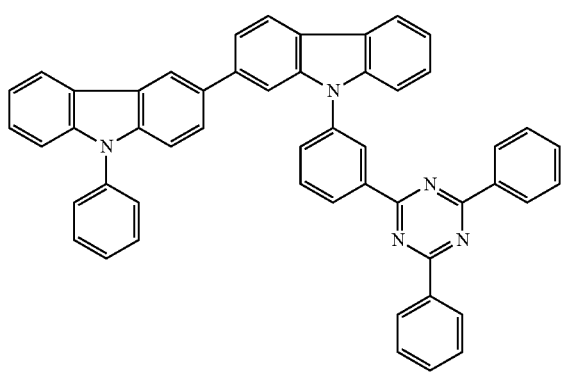
H2

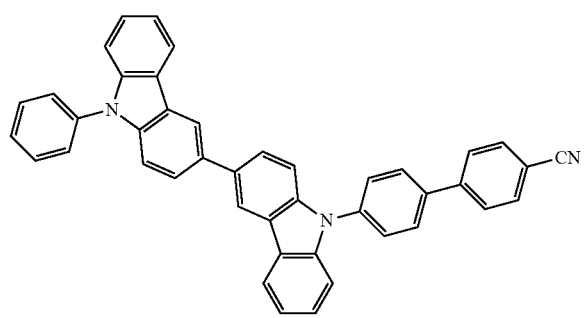
H3

-continued

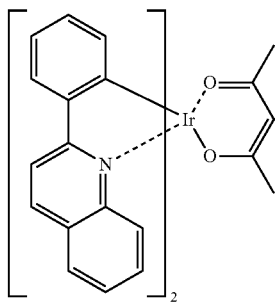
Ir(pq)2(acac)
D1

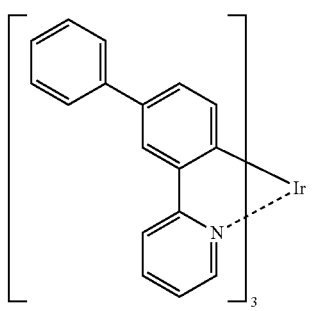
Ir(Ph-ppy)₃
D2

Synthesis of Compound(s)

Synthesis Example 1

Synthesis of Compound H3

Synthesis Example 1-1-1

Synthesis of Intermediate 1-1

[Formula 51]

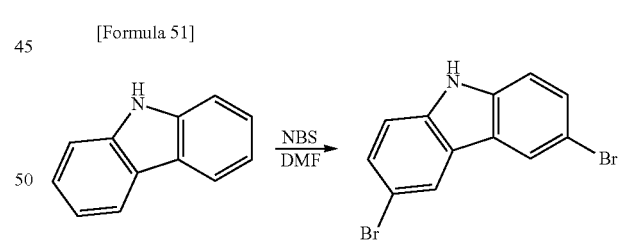
Intermediate 1-1

Under an argon gas atmosphere, to a 1000-mL eggplant flask, carbazole (56 g, 334 mmol) and N,N-dimethylformamide (250 mL) were added and cooled to −7 degrees C. in an ice water bath (in which sodium chloride was added). To the mixture, N,N-dimethylformamide solution (200 mL) of N-bromosuccinimide (119 g, 668 mmol) was dropped and stirred for four hours at −7 degrees C.

The reaction solution was added with pure water to be heated to the room temperature. Subsequently, a precipitated solid was removed by filtration. The obtained solid was repeatedly recrystallized in toluene, so that an intermediate 1-1 (71 g, a yield rate of 65%) was obtained. As a result of FD-MS (Field Desorption Mass Spectrometry) analysis, the reactant was identified as the intermediate 1.

Synthesis Example 1-1-2

Synthesis of Intermediate 1-2

[Formula 52]

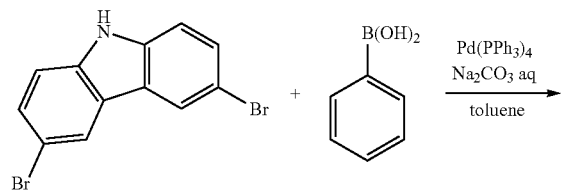

Intermediate 1-1

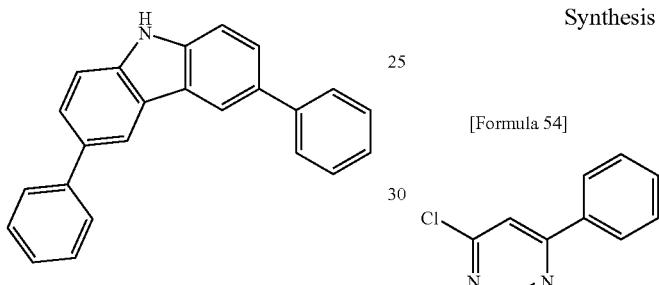

Intermediate 1-2

Under an argon gas atmosphere, to a 2000-mL eggplant flask, the intermediate 1-1 (33 g, 102 mmol), phenylboronic acid (27 g, 221 mmol), tetrakis(triphenylphosphine)palladium (7.0 g, 6.1 mmol), 1,2-dimethoxyethane (600 mL) and 2M sodium carbonate solution (200 mL) were sequentially added and heated to reflux for eight hours.

After the reaction solution was cooled down to the room temperature, an organic layer was removed and an organic solvent was distilled away under reduced pressure. The obtained residue was refined by silica-gel column chromatography, whereby an intermediate 1-2 (19 g, a yield rate of 58%) was obtained. As a result of FD-MS (Field Desoprtion Mass Spectrometry) analysis, the reactant was identified as the intermediate 1-2.

Synthesis Example 1-1-3

Synthesis of Intermediate 1-3

[Formula 53]

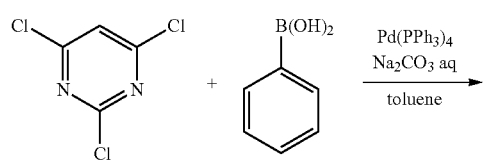

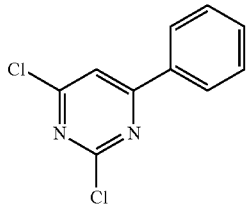

Intermediate 1-3

An intermediate 1-3 was synthesized by the same method as in the synthesis of the intermediate 1-2 except that 2,4,6-trichloropyrimidine was used in place of the intermediate 1-1. As a result of FD-MS (Field Desoprtion Mass Spectrometry) analysis, the reactant was identified as the intermediate 1-3.

Synthesis Example 1-1-4

Synthesis of Intermediate 1-4

[Formula 54]

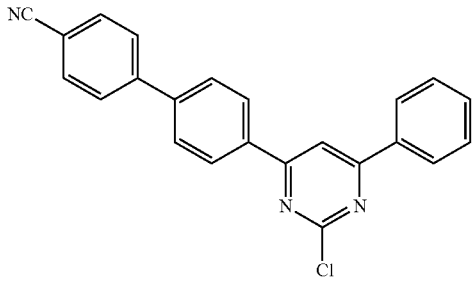

Intermediate 1-4

An intermediate 1-4 was synthesized by the same method as in the synthesis of the intermediate 1-2, except for using the intermediate 1-3 in place of the intermediate 1-1 and 4'-(4,4,5,5-tetramethyl-1,3,2-dioxaboran-2-yl)biphenyl-4-carbonitrile in place of phenylboronic acid. As a result of FD-MS (Field Desoprtion Mass Spectrometry) analysis, the reactant was identified as the intermediate 1-4.

Synthesis Example 1-1-5

Synthesis of Compound H3

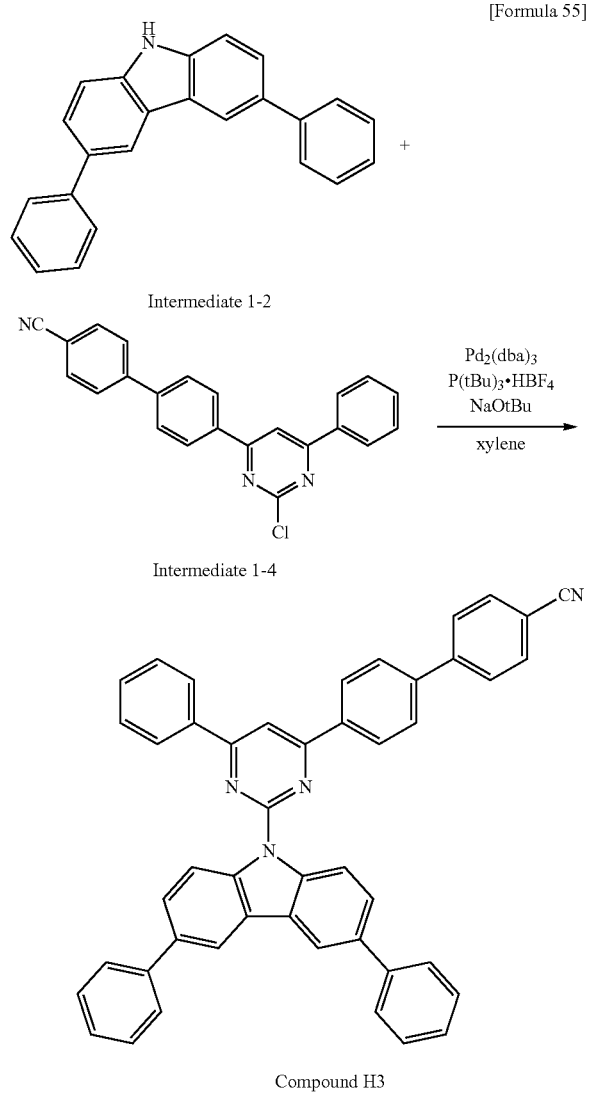

Under an argon gas atmosphere, the intermediate 1-2 (2.3 g, 7.2 mmol), the intermediate 1-4 (3.2 g, 8.6 mmol), tris(dibenzylideneacetone)dipalladium (0.26 g, 0.29 mmol), tri-t-butylphosphonium tetrafluoroborate (0.21 g, 0.72 mmol), sodium t-butoxide (1.4 g, 14 mmol), and anhydrous xylene (40 mL) were sequentially added, and heated to reflux for eight hours.

After the reaction solution was cooled down to the room temperature, an organic layer was removed and an organic solvent was distilled away under reduced pressure. The obtained residue was refined by silica-gel column chromatography, whereby 3.6 g of a yellowish white solid (H3) was obtained.

A result of FD-MS (Field Desoprtion Mass Spectrometry) of the obtained compound and a maximum fluorescent wavelength thereof in a toluene solution FL(PhMe, λex=325 nm; λmax) are shown below:

FDMS, calcd for $C_{47}H_{30}N_4$=650. found m/z=650 (M+)
FL(PhMe, λex=325 nm); λmax, 471 nm Evaluation of Compounds Next, properties of the compounds H1, H2 and H3 used in Example were measured. A measurement method and a calculation method are described below. Measurement results and calculation results are shown in Table 1.

Ionization Potential

A photoelectron spectroscopy in air (AC-1, manufactured by Riken Keiki Co., Ltd.) was used for the measurement. Specifically, a material was irradiated with light and then the amount of electrons generated by charge separation was measured to measure the ionization potential.

Singlet Energy Eg(S)

The target compound to be measured was deposited by evaporation on a quartz substrate to prepare a sample. An absorption spectrum of the sample was measured at a normal temperature (300K). A sample was 100 nm thick. The absorption spectrum was expressed in coordinates of which ordinate axis indicated absorbance and of which abscissa axis indicated the wavelength. A tangent was drawn to the fall of the absorption spectrum on the long-wavelength side, and a wavelength value λedge (nm) at an intersection of the tangent and the abscissa axis was obtained. The wavelength value was converted to an energy value by the following conversion equation. The energy value was defined as EgS.

$$EgS(eV)=1239.85/\lambda edge \quad \text{The conversion equation:}$$

For the measurement of the absorption spectrum, a spectrophotometer (U3310 manufactured by Hitachi, Ltd.) was used.

The tangent to the fall of the absorption spectrum on the long-wavelength side was drawn as follows. While moving on a curve of the absorption spectrum from the maximum spectral value closest to the long-wavelength side in a long-wavelength direction, a tangent at each point on the curve is checked. An inclination of the tangent is decreased and increased in a repeated manner as the curve falls (i.e., a value of the ordinate axis is decreased). A tangent drawn at a point of the minimum inclination closest to the long-wavelength side (except when absorbance is 0.1 or less) is defined as the tangent to the fall of the absorption spectrum on the long-wavelength side.

The maximum absorbance of 0.2 or less was not included in the above-mentioned maximum absorbance on the long-wavelength side.

Triplet Energy Eg(T)

Each of the compounds was measured by a known method of measuring phosphorescence (e.g. a method described in "Hikarikagaku no Sekai (The World of Photochemistry)" (edited by The Chemical Society of Japan, 1993, on and near page 50). Specifically, the organic material was dissolved in a solvent (sample: 10 μmol/L, EPA (diethylether:isopentane:ethanol=5:5:2 in volume ratio, each solvent in a spectroscopic grade), thereby forming a sample for phosphorescence measurement. The sample for phosphorescence measurement was put into a quartz cell, cooled to 77K and irradiated with excitation light, so that phosphorescence intensity was measured while changing a wavelength. The phosphorescence spectrum was expressed in coordinates of which ordinate axis indicated phosphorescence intensity and of which abscissa axis indicated the wavelength.

A tangent was drawn to the rise of the phosphorescent spectrum on the short-wavelength side, and a wavelength value λedge (nm) at an intersection of the tangent and the abscissa axis was obtained. The wavelength value was converted to an energy value by the following conversion equation. The energy value was defined as EgT.

$$Eg(T)(eV)=1239.855/\lambda\text{edge} \quad \text{The conversion equation:}$$

For phosphorescence measurement, a spectrophotofluorometer body F-4500 and optional accessories for low temperature measurement (which were manufactured by Hitachi High-Technologies Corporation) were used. The measurement instrument is not limited to this arrangement. A combination of a cooling unit, a low temperature container, an excitation light source and a light-receiving unit may be used for measurement.

Affinity Af

An affinity was calculated from measured values of the ionization potential Ip and a singlet energy gap Eg(S). The calculation equation is as follows.

$$Af=Ip-Eg(S)$$

The singlet energy gap Eg(S) was measured based on an absorption edge of an absorption spectrum in benzene. Specifically, an absorption spectrum was measured with a commercially available ultraviolet-visible spectrophotometer. The energy gap was calculated from a wavelength at which the spectrum began to rise.

Electron Mobility $\mu(e)$ and Hole Mobility $\mu(h)$

Mobility was evaluated using the impedance spectrometry. A single-carrier device as described below was manufactured. A DC voltage together with AC voltage of 100 mV was applied on the single-carrier device to measure a complex modulus. When the frequency at which the imaginary part of the modulus was maximum was set at $f_{max}$ (Hz), a response time T (sec.) was calculated based on the equation $T=\frac{1}{2}/\pi/f_{max}$. Using this value, the dependence property of the mobility on electric field intensity was determined. The respective single-carrier devices for measurement of the hole mobility $\mu(h)$ and the electron mobility $\mu(e)$ are shown below.

$\mu(h)$: Al/target compounds(150)/ET(5)/LiF(1)/Al
$\mu(e)$: ITO/HT(5)/target compounds(100)/Al (Numerals in parentheses indicate a film thickness. unit: nm)

TABLE 1

| | Ip (eV) | Af (eV) | Eg(S) (eV) | Eg(T) (eV) | $\mu(e)$ (cm$^2$/Vs) | $\mu(h)$ (cm$^2$/Vs) |
|---|---|---|---|---|---|---|
| H1 | 5.5 | 2.3 | 3.2 | 2.6 | <10$^{-7}$ | 10$^{-5}$ |
| H2 | 5.6 | 2.5 | 3.1 | 2.7 | 10$^{-7}$ | 10$^{-8}$ |
| H3 | 5.7 | 2.4 | 3.3 | 2.7 | 10$^{-7}$ | 10$^{-8}$ |

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum deposition apparatus, so that a compound HI was initially formed by resistance heating deposition onto a surface of the glass substrate where the transparent electrode line was provided so as to cover the transparent electrode. Thus, a 20 nm thick hole injecting layer adjacent to the anode was formed.

A compound HT was laminated on the hole injecting layer by resistance heating deposition. Thus, a 30 nm thick hole transporting layer was formed.

A compound H1 (the first host material) and a compound D1 (the first dopant material) were co-deposited by resistance heating on the hole transporting layer. Thus, a 10 nm thick first emitting layer of red emission was formed. A concentration of the compound D1 was set at 8 mass %.

A compound H2 (the second host material), a compound H3 (the third host material) and a compound D2 (the second dopant material) were co-deposited by resistance heating on the first emitting layer. Thus, a 30 nm thick second emitting layer of green emission was formed. A concentration of the compound D2 was set at 15 mass %. A mass (concentration) of the third host material relative to the total mass of the second host material and the third host material in the second emitting layer was set at 5 mass %.

A compound ET was laminated on the green emitting layer by resistance heating deposition. Thus, a 35 nm thick electron transporting layer was formed.

LiF was further deposited on the electron transporting layer to form a 1 nm thick electron injecting layer. A metal Al was further deposited on the electron injecting layer to form an 80-nm thick cathode.

Examples 2 to 4 and Comparatives 1 to 3

In Examples 2 to 4 and Comparatives 1 to 3, organic EL devices were formed in the same manner as in Example 1 except that the film thickness of the first emitting layer, the film thickness of the second emitting layer, the third host material, the concentration of the third host material and the like were replaced as shown in Table 2.

TABLE 2

| | Film thickness of first emitting layer (nm) | Film thickness of second emitting layer (nm) | Third host material | Concentration of third host material (mass %) |
|---|---|---|---|---|
| Ex. 1 | 10 | 30 | H3 | 5 |
| Ex. 2 | 10 | 30 | H3 | 10 |
| Ex. 3 | 10 | 30 | H3 | 40 |
| Ex. 4 | 10 | 30 | H3 | 60 |
| Comp. 1 | 10 | 30 | — | — |
| Comp. 2 | 10 | 50 | — | — |
| Comp. 3 | 5 | 30 | — | — |

Evaluation of Organic EL Devices

The prepared organic EL devices in Examples 1 to 4 and Comparatives 1 to 3 were evaluated in terms of drive voltage at the current density of 3.00 mA/cm$^2$, CIE1931 chromaticity, current efficiency L/J, power efficiency η, and lifetime LT90. The results are shown in Table 3.

Drive Voltage

Electrical current was applied between ITO and Al such that the current density was 3.00 mA/cm$^2$, where voltage (unit: V) was measured.

CIE1931 Chromaticity

Voltage was applied on each of the organic EL devices such that the current density was 3.00 mA/cm$^2$, where coordinates of CIE1931 chromaticity were measured by a spectroradiometer (CS-1000 manufactured by Konica Minolta, Inc.).

Current Efficiency L/J and Power Efficiency η

Voltage was applied on each of the organic EL devices such that the current density was 3.00 mA/cm², where spectral radiance spectra were measured by the aforementioned spectroradiometer. Based on the obtained spectral radiance spectra, the current efficiency (unit: cd/A) and the power efficiency η (unit: lm/W) were calculated. Lifetime LT90

Voltage was applied on the organic EL devices such that the current density was 50 mA/cm², where a time (unit: hrs) elapsed before a luminance intensity was reduced to 90% of the initial luminance intensity was measured.

TABLE 3

|  | Voltage | CIE | | L/J | η | LT90 |
|---|---|---|---|---|---|---|
|  | (V) | x | y | (cd/A) | (lm/W) | (hr) |
| Ex. 1 | 3.2 | 0.407 | 0.560 | 48.2 | 46.7 | 84 |
| Ex. 2 | 3.3 | 0.398 | 0.568 | 45.8 | 43.6 | 91 |
| Ex. 3 | 3.4 | 0.361 | 0.599 | 54.1 | 49.4 | 83 |
| Ex. 4 | 3.6 | 0.343 | 0.615 | 57.9 | 51.0 | 73 |
| Comp. 1 | 3.1 | 0.436 | 0.534 | 42.0 | 42.9 | 90 |
| Comp. 2 | 3.8 | 0.401 | 0.564 | 46.2 | 38.2 | 91 |
| Comp. 3 | 3.1 | 0.436 | 0.534 | 41.9 | 42.8 | 81 |

As understood from Tables 2 and 3, in Examples 1 to 4 in which third host material H3 was contained in the second emitting layer, chromaticity CIE was enabled to be changed only by changing the concentration of the third host material H3 without changing the film thickness of each of the first emitting layer and the second emitting layer. In contrast, in Comparatives 1 to 3 in which no third host material H3 was contained in the second emitting layer, chromaticity CIE was changed by changing the film thickness. However, in Comparative 2 in which the film thickness of the second emitting layer was increased, the voltage was significantly increased as compared with in Comparative 1. In Comparative 3 in which the film thickness of the first emitting layer was decreased, no change in chromaticity CIE was observed although the film thickness of the first emitting layer was decreased to half, as compared with in Comparative 1.

The invention claimed is:

1. An organic electroluminescence device comprising: an anode; a cathode; and at least a first emitting layer and a second emitting layer interposed between the anode and the cathode, wherein the first emitting layer comprises a first host material and a first dopant material, the second emitting layer comprises a second host material, a third host material and a second dopant material, the first host material, the second host material and the third host material satisfy a formula (N-4) below, $$\mu(e)_{H2} \geq \mu(e)_{H3} > \mu(e)_{H1} \qquad (N-4)$$

where: $\mu(e)_{H1}$ is an electron mobility of the first host material, $\mu(e)_{H2}$ is an electron mobility of the second host material, and $\mu(e)_{H3}$ is an electron mobility of the third host material;

wherein an ionization potential $Ip_{H1}$ of the first host material and an ionization potential $Ip_{H3}$ of the third host material satisfy a formula (N-5) below when a hole mobility $\mu(h)_{H1}$ of the first host material is $10^{-6}$ cm²/Vs or more, $$Ip_{H1} < Ip_{H3} \qquad (N-5).$$

2. The organic electroluminescence device according to claim 1, wherein
the second host material and the third host material satisfy a formula (N-1) below and at least one of formulae (N-2) and (N-3) below, $$Af_{H2} \geq Af_{H3} \qquad (N-1)$$

$$\mu(e)_{H2} > \mu(e)_{H3} \qquad (N-2)$$

$$Eg(S)_{H2} < Eg(S)_{H3} \qquad (N-3)$$

where: in the formula (N-1), $Af_{H2}$ is an affinity of the second host material and $Af_{H3}$ is an affinity of the third host material,
in the formula (N-3), $Eg(S)_{H2}$ is singlet energy of the second host material and $Eg(S)_{H3}$ is singlet energy of the third host material.

3. The organic electroluminescence device according to claim 1, wherein
the singlet energy $Eg(S)_{H2}$ of the second host material and the singlet energy $Eg(S)_{H3}$ of the third host material satisfy a formula (N-31) below, $$\Delta Eg(S) = Eg(S)_{H3} - Eg(S)_{H2} > 0.2(eV) \qquad (N-31).$$

4. The organic electroluminescence device according to claim 1, wherein
the electron mobility $\mu(e)_{H2}$ of the second host material and the electron mobility $\mu(e)_{H3}$ of the third host material satisfy a formula (N-21) below, $$\Delta\mu(e) = \mu(e)_{H2}/\mu(e)_{H3} > 10^2 \qquad (N-21).$$

5. The organic electroluminescence device according to claim 1, wherein
the first dopant material exhibits a luminescence peak of 570 nm or more, and
the second dopant material exhibits a luminescence peak of less than 570 nm.

6. The organic electroluminescence device according to claim 1, wherein
the second host material is an azine derivative.

7. The organic electroluminescence device according to claim 1, wherein
the first emitting layer is provided closer to the anode than the second emitting layer.

8. The organic electroluminescence device according to claim 1, wherein
a triplet energy of the second host material is larger than a triplet energy of the first host material.

9. The organic electroluminescence device according to claim 1, further comprising a third emitting layer.

10. The organic electroluminescence device according to claim 9, wherein
the third emitting layer is provided closer to the anode than the first emitting layer and the second emitting layer.

11. The organic electroluminescence device according to claim 9, wherein
the third emitting layer is provided closer to the cathode than the first emitting layer and the second emitting layer.

* * * * *